US008470409B2

(12) United States Patent
Volinsky et al.

(10) Patent No.: US 8,470,409 B2
(45) Date of Patent: Jun. 25, 2013

(54) NANOWIRES, METHOD OF FABRICATION THE SAME AND USES THEREOF

(75) Inventors: Roman Volinsky, Beer-Sheva (IL); Raz Jelinek, Reut (IL)

(73) Assignee: Ben Gurion University of the Negev Research and Development Authority, Beer Sheva (IL)

( * ) Notice: Subject to any disclaimer, the term of this patent is extended or adjusted under 35 U.S.C. 154(b) by 545 days.

(21) Appl. No.: 12/756,273

(22) Filed: Apr. 8, 2010

(65) Prior Publication Data
US 2010/0272993 A1    Oct. 28, 2010

Related U.S. Application Data

(60) Provisional application No. 61/213,011, filed on Apr. 28, 2009.

(51) Int. Cl.
*B05D 3/00* (2006.01)
*C08J 7/18* (2006.01)
*G21H 5/00* (2006.01)

(52) U.S. Cl.
USPC ........... 427/554; 427/553; 977/762; 977/764; 977/880; 977/890; 977/892

(58) Field of Classification Search
USPC .................. 427/554, 212, 553; 977/892, 880, 977/762, 764, 890
See application file for complete search history.

(56) References Cited

PUBLICATIONS

Kim et al., "Langmuir-Blodgett Nanorod Assembly", Journal of the American Chemical Society, 2001, 123, 4360-4361.*
Lamm et al. "Laterally Spaced Linear Nanoparticle Arrays Templated by Laminated β-Sheet Fibrils", Advanced Materials, 20: 447-451, 2008.
Patolsky et al. "Au-Nanoparticle Nanowires Based on DNA and Polylysine Templates", Angewandte Chemie, Inernational Edition, 41(13: 2323-2327, 2002.
Brust et al. "Langmuir-Blodgett Films of Alkane Chalcogenide (S,Se,Te) Stabilized Gold Nanoparticles", Nano Letters, 1(4): 189-191, 2001.
Kim et al. "Langmuir-Blodgett Nanorod Assembly", Journal of the American Chemical Society, JACS, 123(18): 4360-4361, 2001.
Park et al. "DNA-Programmable Nanoparticle Crystallization", Nature, 451: 553-556, Jan. 31, 2008.

* cited by examiner

*Primary Examiner* — Michael Cleveland
*Assistant Examiner* — Michael Wieczorek

(57) ABSTRACT

A method of forming a nanowire structure is disclosed. The method comprises applying on a surface of carrier liquid a layer of a liquid composition which comprises a surfactant and a plurality of nanostructures each having a core and a shell, and heating at least one of the carrier liquid and the liquid composition to a temperature selected such that the nanostructures are segregated from the surfactant and assemble into a nanowire structure on the surface.

20 Claims, 13 Drawing Sheets

NANOWIRES, METHOD OF FABRICATION THE SAME AND USES THEREOF

RELATED APPLICATIONS

This application claims the benefit of priority from U.S. Provisional Patent Application No. 61/213,011 filed on Apr. 28, 2009, the contents of which are incorporated herein by reference.

FIELD AND BACKGROUND OF THE INVENTION

The present invention, in some embodiments thereof, relates to nanotechnology and, more particularly, but not exclusively, to a nanowire structure, a method of fabricating a nanowire and systems incorporating the nanowire.

Nanoscience is the science of small objects and is one of the most important research frontiers in modern science. These small objects are of interest from a fundamental view point since all properties of a material, such as its melting point and its electronic and optical properties, change when the particles that make up the material become nanoscopic. With new properties come new opportunities for technological and commercial development, and applications of nanometric objects have been shown or proposed in areas as diverse as micro- and nanoelectronics, nanofluidics, coatings, paints and biotechnology.

It is well established that future development of microelectronics, magnetic recording devices and chemical sensors will be achieved by increasing the packing density of device components. Traditionally, microscopic devices have been formed from larger objects, but as these products get smaller, below the micron level, this process becomes increasingly difficult. It is therefore appreciated that the opposite approach is to be employed, essentially, the building of microscopic devices from using a bottom up approach, primarily via objects of nanometric dimensions. Self-assembled nanostructures, allow controlled fabrication of novel nanoscopic materials and devices.

In particular, wire-like nanostructures have attracted extensive interest over the past decades due to their great potential for addressing some basic issues about dimensionality and space confined transport phenomena as well as related applications. Wire-like nanostructures often have distinctive properties and can be used as transparent conducting materials and gas sensors.

Widely used objects in nanotechnology are fullerene carbon nanotubes which are elongated objects having carbon hexagonal mesh sheet of carbon substantially in parallel with their axis. Also known are other types of nanostructures, such as peptide nanotubes assembled through hydrogen-bonding interactions of peptide building blocks, and lipid nanotubes self-assembled from lipid surfactants.

Heretofore, several approaches have utilized to assemble gold nanostructures by conjugating them with biomolecules. For example, gold nanowires were fabricated by the intercalation of gold nanoparticles into a double-stranded DNA, followed by photochemical covalent attachment of the intercalator with a DNA template [Patolsky et al., *Angew. Chem. Int. Ed.* 2002, 41, 2323]. More recently, linear arrays of gold nanoparticle were fabricated using specially designed peptides that self-assemble into β-sheet fibrils exhibiting a laminated morphology [M. S. Lamm, N. Sharma, K. Rajagopal, F. L. Beyer, J. P. Schneider, Adv. Mater. 2008, 20, 447], and micrometric-size crystal structures of gold nanoparticles were assembled via various DNA linkers [Park et al., Nature 2008, 451, 553].

Formation of films of gold nanoparticles has been disclosed, e.g., by Brust et al. in Nano Lett. 2001, 1, 189. Gold nanoparticles stabilized by the adsorption of a monolayer of alkanethiolates and chloroform solutions of the stabilized nanoparticles were spread and evaporated at a water-air interface to form Langmuir films. Another technique is disclosed in Kim et al., J Am Chem Soc 2001, 123, 4360. In this technique, colloidal suspension of $BaCrO_4$ nanorods was spread on a water surface of a Langmuir-Blodgett trough, and subsequently compressed, starting with a nonzero surface pressure, to form two-dimensional nanorod mono- and multilayers.

SUMMARY OF THE INVENTION

According to an aspect of some embodiments of the present invention there is provided a method of forming a nanowire structure. The method comprises applying a layer of a liquid composition on a surface of carrier liquid. The liquid composition comprises a surfactant and a plurality of nanostructures, wherein each of nanostructures has a core enclosed by a hydrophobic or amphiphilic shell. The method further comprises heating the carrier liquid and/or liquid composition to a temperature T selected such that the nanostructures are segregated from the surfactant and assemble into a nanowire structure on the surface.

According to some embodiments of the invention the method further comprises preparing the liquid composition.

According to some embodiments of the invention the method further comprises coating nanoparticles by hydrophobic or amphiphilic shells thereby forming the nanostructures of the liquid composition.

According to some embodiments of the invention the method further comprises transferring the nanowire structure from the surface of the carrier liquid to a solid support.

According to some embodiments of the invention the method further comprises treating the nanowire structure so as to remove the shells from the nano structures.

According to some embodiments of the invention the heating is effected by laser radiation.

According to some embodiments of the invention the method further comprises scanning the layer by the laser radiation along a predetermined pattern so as to locally heat the layer along the pattern and to shape the nanowire structure according to the pattern.

According to some embodiments of the invention the method further comprises scanning the layer by the laser radiation along a predetermined pattern so as to locally heat the layer along the pattern and to form on the surface a circuitry of nanowire structures according to the pattern.

According to some embodiments of the invention the layer is in a liquid-expanded phase.

According to some embodiments of the invention a surface pressure of the layer is less than 1 mN/m.

According to some embodiments of the invention the temperature T is selected such that the segregation and the assembling are reversible.

According to some embodiments of the invention the temperature T is higher than a threshold temperature $T_0$ defined as a minimal temperature at which there is no phase transition from a liquid-expanded phase to a liquid-condensed phase anywhere on the layer for any surface pressure of the layer.

According to some embodiments of the invention a difference between the temperature and the threshold temperature is less than 5 degrees centigrade, or less than 4 degrees centigrade or less than 3 degrees centigrade or less than 2 degrees centigrade, e.g., about 1 degree centigrade or less.

According to some embodiments of the invention the surfactant and the shell are selected such that the threshold temperature is from about 5 degrees centigrade to about 40 degrees centigrade.

According to some embodiments of the invention the surfactant is an amphiphilic compound capable of forming a layer on a surface of an aqueous solution.

According to some embodiments of the invention surfactant is a fatty acid. According to some embodiments of the invention the fatty acid is an unsaturated fatty acid. According to some embodiments of the invention the fatty acid is a monounsaturated fatty acid.

According to some embodiments of the invention the fatty acid has from 18 to 22 carbon atoms.

According to some embodiments of the invention the fatty acid is selected from the group consisting of palmitoleic acid (9-hexadecanoic acid), oleic acid and elaidic acid (cis- and trans-9-octadecanoic acid, respectively), vaccenic acid (11-octadecanoic acid), gadeloic acid (9-eicosenoic acid) and erucic acid (13-docosenoic acid).

According to some embodiments of the invention the fatty acid is selected from the group consisting of an elaidic acid, an oleic acid and an erucic acid.

According to some embodiments of the invention the shell comprises a thiol-containing hydrocarbon chain. According to some embodiments of the invention the shell comprises alkanethiol. According to some embodiments of the invention the shell comprises dodecanethiol.

According to some embodiments of the invention the shell comprises an amine-containing hydrocarbon chain. According to some embodiments of the invention the shell comprises dodecylamine.

According to some embodiments of the invention the shell is prepared from a surfactant selected from the group consisting of dodecanethiol, octanethiol, dodecylamine, tetradecylammonium bromide, tetraoctylammonium bromide and any mixture thereof.

According to some embodiments of the invention the core is made of a metal. According to some embodiments of the invention the core is made of gold.

According to some embodiments of the invention the core is made of a semiconductor material.

According to some embodiments of the invention the core is made of a dielectric material.

According to some embodiments of the invention the core is made of a ferromagnetic material.

According to some embodiments of the invention the core is made of a thermoelectric material.

According to some embodiments of the invention the carrier liquid is an aqueous solution. According to some embodiments of the invention the carrier liquid is water.

According to an aspect of some embodiments of the present invention there is provided a nanowire structure manufactured by the method described herein.

According to an aspect of some embodiments of the present invention there is provided a nanowire circuitry manufactured by the method described herein.

According to an aspect of some embodiments of the present invention there is provided a nanowire structure. The nanowire structure comprises a pattern of linear sub-structures interconnected thereamongst to form an elongated solid structure. Each linear sub-structure is formed of a plurality of nanoparticles. According to some embodiments of the invention an average diameter of the sub-structures is less than 50 nanometers and an average diameter of the elongated solid structure is at least five times the average diameter of the sub-structures. According to some embodiments of the invention the average diameter of the elongated solid structure is less than 1 micrometer.

According to an aspect of some embodiments of the present invention there is provided a nanowire circuitry comprising a pattern of nanowire structures, wherein at least one of the nanowire structures is the nanowire structure According to some embodiments of the invention the average density of the nanoparticles is at least 4 nanoparticles per 100 square nanometers.

According to some embodiments of the invention the nanoparticles are made of a metal. According to some embodiments of the invention the metal is gold. Optionally, the nanoparticles are made of a semiconductor material and/or a dielectric material and/or a ferromagnetic material and/or a thermoelectric material.

According to an aspect of some embodiments of the present invention there is provided an electronic switching or amplifying device. The device comprises a source electrode, a drain electrode, a gate electrode and a channel. According to some embodiments of the invention at least one of the gate electrode and the channel comprises a nanowire structure as described herein or manufactured according to the method described herein.

According to an aspect of some embodiments of the present invention there is provided an electronic inverter. The electronic inverter comprises a first switching device and a second switching device, each of the first switching device and the second switching device comprising a source electrode, a drain electrode, a gate electrode and a channel, such that a drain electrode of the first switching device is electrically communicating with a source electrode of the second switching device. According to some embodiments of the invention at least one of the gate electrode and the channel comprises a nanowire structure as described herein or manufactured according to the method described herein.

According to an aspect of some embodiments of the present invention there is provided a transistor. The transistor comprises a first nanowire structure and a second nanowire structure forming a junction with the first nanowire structure, wherein each of the nanowire structures is a nanowire structure as described herein or manufactured according to the method described herein. According to some embodiments of the invention nanoparticles of the first nanowire structure are made of an n-type semiconductor material, and nanoparticles of the first nanowire structure are made of a p-type semiconductor material.

A crossbar array, comprising a plurality of junctions each formed by a pair of crossed nanowire structures and at least one connector connecting the pair of crossed nanowire structures, the at least one connector and the pair of crossed nanowire structures forming an electrochemical cell, wherein at least one of the nanowire structures is a nanowire structure as described herein or manufactured according to the method described herein.

According to an aspect of some embodiments of the present invention there is provided a device for detecting a position and/or movement of an object. The device comprises a plurality of non-intersecting nanowire structures, each being connected to an electronic circuitry, such that when the object contacts at least one nanowire structure of the plurality of non-intersecting nanowire structures, the at least one nanowire structure intersects with at least one additional nanowire structure of the plurality of non-intersecting nanowire structures, thereby allowing the electronic circuitry to generate a signal representative of the position and/or movement of an object. At least one of the nanowire structures of the device is a nanowire structure as described herein or manufactured according to the method described herein.

According to an aspect of some embodiments of the present invention there is provided an electronic circuit assembly. The assembly comprises conductive lines being arranged in at least two layers separated therebetween by a dielectric layer, wherein conductive lines of at least a pair of layers of the at least two layers are electrically connected therebetween via at least one conductive nanowire structure. At least one nanowire structure of the assembly is a nanowire structure as described herein or manufactured according to the method described herein.

According to an aspect of some embodiments of the present invention there is provided a memory cell. The memory comprises a plurality of magnetic nanowire structures, each being capable of assuming two magnetization states and is connected to two conductive lines defining an address of a magnetic nanowire structure connected thereto, wherein each of the magnetic nanowire structures is a nanowire structure as described herein or manufactured according to the method described herein, and wherein nanoparticles of each of the magnetic nanowire structures are made of a ferromagnetic material.

According to an aspect of some embodiments of the present invention there is provided a field emitter device. The device comprises an electrode and a nanowire structure, the electrode and the nanowire structure being designed and constructed such that when an electrical field is formed therebetween, electrons are emitted from the nanowire structure, wherein the nanowire structure is a nanowire structure as described herein or manufactured according to the method described herein.

According to an aspect of some embodiments of the present invention there is provided apparatus for electron emission lithography. The apparatus comprises (a) an electron emission source being at a first electrical potential, the electron emission source including at least one nanowire structure; and (b) an electrically conducting mounting device being in a second electrical potential which is different from the first electrical potential. A difference between the second electrical potential and the first electrical potential is selected such that electrons are emitted from the electron emission source and impinge on the mounting device to thereby perform a lithography process on a sample mounted on the mounting device. At least one nanowire structure of the apparatus is a nanowire structure as described herein or manufactured according to the method described herein.

According to an aspect of some embodiments of the present invention there is provided a thermoelectric device. The device comprises a first heat conducting layer and a second heat conducting layer, the first and the second heat conducting layers being interposed by a plurality of nanowire structures, such that when current flows through the plurality of nanowires, heat is transferred out of the first heat conducting layer and is dissipated through the second heat conducting layer. At least one of the nanowire structures of the device is a nanowire structure as described herein or manufactured according to the method described herein.

According to an aspect of some embodiments of the present invention there is provided a thermoelectric system having an arrangement of thermoelectric devices, each one of the thermoelectric devices being the thermoelectric device described herein.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1A:
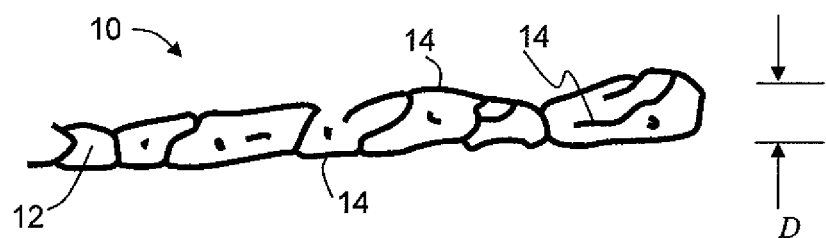
FIGS. 1A and 1B are schematic illustrations of a nanowire structure according to various exemplary embodiments of the present invention.

The present invention, in some embodiments thereof, relates to nanotechnology and, more particularly, but not exclusively, to a nanowire, a method of fabricating a nanowire and systems incorporating the nanowire.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1B:
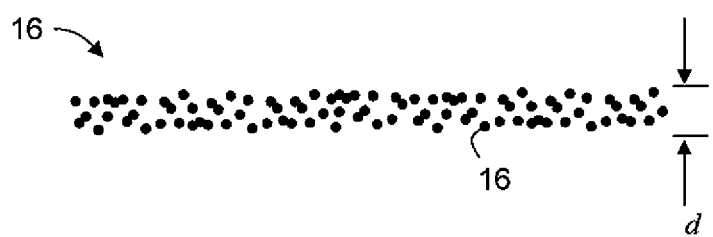

Referring now to the drawings, FIGS. 1A and 1B illustrate a nanowire structure 12 according to various exemplary embodiments of the present invention. A preferred method suitable for forming nanowire structure 12 is provided hereinunder. Microscopy images exemplifying embodiments of nanowire structure 12 are provided in the Examples section that follows (see, e.g., FIGS. 17A-C which are Brewster angle microscopy images exemplifying an embodiment of the nanowire structure at a micrometer scale and FIGS. 18A-B which are electron transmission microscopy images exemplifying an embodiments of the nanowire structure at a nanometric scale).

Nanowire structure 12 comprises a pattern 10 of linear sub-structures 14 interconnected thereamongst to form an elongated solid structure. Linear sub-structures 14 can be shaped as straight lines or curved lines. For example, linear sub-structures 14 can be shaped as closed or open loops.

The term "elongated solid structure" refers to a three-dimensional body made of a solid substance, in which one of its dimensions is at least 2 times, more preferably at least 10 times, more preferably at least 100 times, e.g., at least 500 times larger than any of the other two dimensions. The largest dimension of the elongated solid structure is referred to herein as the longitudinal dimension, and the dimensions are referred to herein as the transverse dimensions. In some embodiments of the present invention the solid substance is crystalline.

Thus, the nanowire structure of the present embodiments is an elongated solid structure. In various exemplary embodiments of the invention the length of the nanowire structure is at least 10 μm, more preferably at least 100 μm, more preferably at least 500 μm, e.g., about 1 mm or more. Nanowire structure 12 can further comprise one or more sub-substructures which are disconnected from other sub-substructures.

A magnified illustration of a single representative sub-structure 14 according to some embodiments of the present invention is shown in FIG. 1B. In these embodiments linear sub-structure 14 is formed of a plurality of nanoparticles 16. In various exemplary embodiments of the invention nanoparticles 16 are distinguishable by means of transmission electron microscopy (TEM). Namely, individual nanoparticles can be observed in a TEM image of sufficient magnification (e.g., 50K or 100K magnification) capturing the sub-structure.

The average diameter d of sub-structures 14 is less than 50 nanometers, more preferably less than 40 nanometers, more preferably less than 30 nanometers, e.g., about 20 nanometers. The average diameter D of nanowire structure 14 is at least 5 d, or at least 10 d, or at least 20 d, or at least 30 d, or at least 40 d, or at least 50 d.

In some embodiments of the present invention the average density of nanoparticles 16 is at least 4, or at least 6, or at least 8 or at least 10 nanoparticles per 100 square nanometers.

Many types of nanoparticles 16 are contemplated. The nanoparticles can include atoms that form inorganic conductors, dielectrics or semiconductors. Representative examples of atoms that may be used in nanoparticle 16 can be found in the elements from the IIA, IIIA, IVA, VA, VIA, VIIA, IB, IIB, IIIB and IVB columns of the periodic table, their oxides, nitrides and sulfides, and IIIB/VB and II/VIB semiconductor compounds.

Because of their ultra-small size, nanoparticles 16 can impart novel mechanical, optical, electrical and magnetic properties to nanowire structure 12 and the devices and systems that are assembled from them.

Non-limiting examples of nanoparticles that are suitable for the present embodiments include metal, such as gold (Au), silver (Ag), cobalt (Co), iron (Fe), nickel (Ni), copper (Cu), manganese (Mn), carbon (C), alloys thereof and any combination of the foregoing. Also contemplated are materials such as, but not limited to, silicon (Si), titanium (Ti), bismuth (Bi), tellurium (Te), lead (Pb) silicon carbide (SiC), cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), aluminum nitride (AlN), aluminum oxide, aluminum sulfide (AlS), aluminum phosphide (AlP), aluminum arsenide (AlAs), aluminum antimonide (AlSb), lead sulfide (PbS), lead selenide (PbSe), lead telluride (PbTe), gallium arsenide (GaAs), gallium nitride (GaN), gallium phosphide (GaP), gallium antimonide (GaSb), indium arsenide (InAs), indium nitride (InN), indium phosphide (InP), indium antimonide (InSb), indium oxide (InO), indium tin oxide (ITO), thallium arsenide (TlAs), thallium nitride (TlN), thallium phosphide (TlP), thallium antimonide (TlSb), zinc oxide (ZnO), zinc cadmium selenide (ZnCdSe), indium gallium nitride (InGaN), indium gallium arsenide (InGaAs), indium gallium phosphide (InGaP), aluminum indium nitride (AlInN), indium aluminum phosphide (InAlP), indium aluminum arsenide (InAlAs), aluminum gallium arsenide (AlGaAs), aluminum gallium phosphide (Al- GaP), aluminum indium gallium arsenide (AlInGaAs), aluminum indium gallium nitride (AlInGaN), magnetite ($Fe_3O_4$) and any mixtures thereof. In some embodiments of the present invention nanoparticles 16 are made of metal, such as, but not limited to, gold or silver.

In some embodiments of the present invention one or more nanoparticles 16 is of a binary semiconductor material, e.g., a nanoparticle of the formula MX, where M can be cadmium, zinc, mercury, aluminum, lead, tin, gallium, indium, thallium, magnesium, calcium, strontium, barium, copper, and mixtures or alloys thereof and X is sulfur, selenium, tellurium, nitrogen, phosphorus, arsenic, antimony, and mixtures or alloys thereof.

In some embodiments of the present invention one or more of nanoparticles 16 is of a ternary semiconductor material, e.g., a nanoparticle of the formula $M_1M_2X$, where $M_1$ and $M_2$ can be cadmium, zinc, mercury, aluminum, lead, tin, gallium, indium, thallium, magnesium, calcium, strontium, barium, copper, and mixtures or alloys thereof and X is sulfur, selenium, tellurium, nitrogen, phosphorus, arsenic, antimony, and mixtures or alloys thereof.

In some embodiments of the present invention one or more of nanoparticles 16 is of a quaternary semiconductor material, e.g., a nanoparticle of the formula $M_1M_2M_3X$, where $M_1$, $M_2$ and $M_3$ can be cadmium, zinc, mercury, aluminum, lead, tin, gallium, indium, thallium, magnesium, calcium, strontium, barium, copper, and mixtures or alloys thereof and X is sulfur, selenium, tellurium, nitrogen, phosphorus, arsenic, antimony, and mixtures or alloys thereof.

In some embodiments of the present invention one or more of nanoparticles 16 is of a quaternary semiconductor material, e.g., a core of a formula such as $M_1X_1X_2$, $M_1M_2X_1X_2$, $M_1M_2M_3X_1X_2$, $M_1X_1X_2X_3$, $M_1M_2X_1X_2X_3$ or $M_1M_2M_3X_1X_2X_3$, where $M_1$, $M_2$ and $M_3$ can be cadmium, zinc, mercury, aluminum, lead, tin, gallium, indium, thallium, magnesium, calcium, strontium, barium, copper, and mixtures or alloys thereof and $X_1$, $X_2$ and $X_3$ can be sulfur, selenium, tellurium, nitrogen, phosphorus, arsenic, antimony, and mixtures or alloys thereof.

In some embodiments of the present invention one or more of nanoparticles 16 is made of carbon, e.g., the form of fullerene, such as $C_{60}$ and higher homologs. For example, one or more of nanoparticles 16 can be a carbon nanostructure. The present embodiments contemplate any type of carbon nanostructure, including without limitation, a single-walled nanotube (SWNT) which can be considered as a long wrapped graphene sheet and a multi walled nanotube (MWNT) which can be considered as a collection of concentric SWNTs with different diameters.

It is to be understood that nanoparticles 16 can exist in a variety of shapes, including but not limited to spheroids, rods, disks, pyramids, cubes and a plurality of other shapes characterized by a constant or non-constant sectional curvature. While these shapes can affect the physical, optical and electronic characteristics of nanoparticles 16, the specific shape does not bear on the qualification of these objects as nanoparticles.

It will be understood by one of ordinary skill in the art that when referring to a population of nanoparticles as being of a particular "size", what is meant is that the population is made up of a distribution of sizes around the stated "size". Unless otherwise stated, the "size" used to describe a particular population of particles is the mode of the size distribution.

For convenience, the size of the nanoparticles can be described in terms of a "diameter". In the case of spherically or circularly shaped nanoparticles, diameter is used as is commonly understood. When the shape of the nanoparticle includes more than one diameter (for example, a spheroid or an ellipsoid which may have two or three different diameters), the diameter of a nanoparticle refers to the largest of these diameters. For other shapes (e.g., shapes for which the diameter is not well-defined mathematically) the term "diameter", unless otherwise defined, refers to twice a radius of revolution (e.g., a smallest or average radius of revolution) in which the entire nanoparticle can fit.

In some embodiments of the present invention the size of the particles is less than 30 nm or less than 20 nm or less than 10 nm or less than 5 nm. For example, the nanoparticles can be metal nanoparticles having a shape of a spheroid, about 3 nm in diameter. Other sizes are not excluded from the scope of the present invention.

Nanoparticles 16 can also have a core-shell structure, in which case the core is of one substance and the shell is of another substance.

Figure 2:
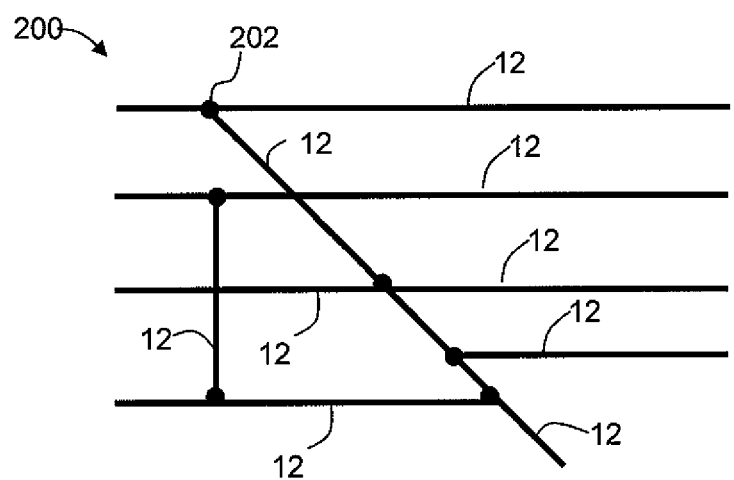
FIG. 2 is a schematic illustration of a nanowire circuitry, according to various exemplary embodiments of the present invention.

Nanowire structure 12 can be used in various areas, including, without limitation, microelectronics, nanoelectronics, coatings, biotechnology and the like. For example, a plurality of nanowire structures such as nanowire structure 12 can be arranged to form a nanowire circuitry 200. A representative example of nanowire circuitry 200 is illustrated in FIG. 2. Some of the nanowire structures in nanowire circuitry 200 can be connected to form one or more electric junctions 202. In these embodiments, nanoparticles 16 are preferably electrically conductive.

Figure 3:
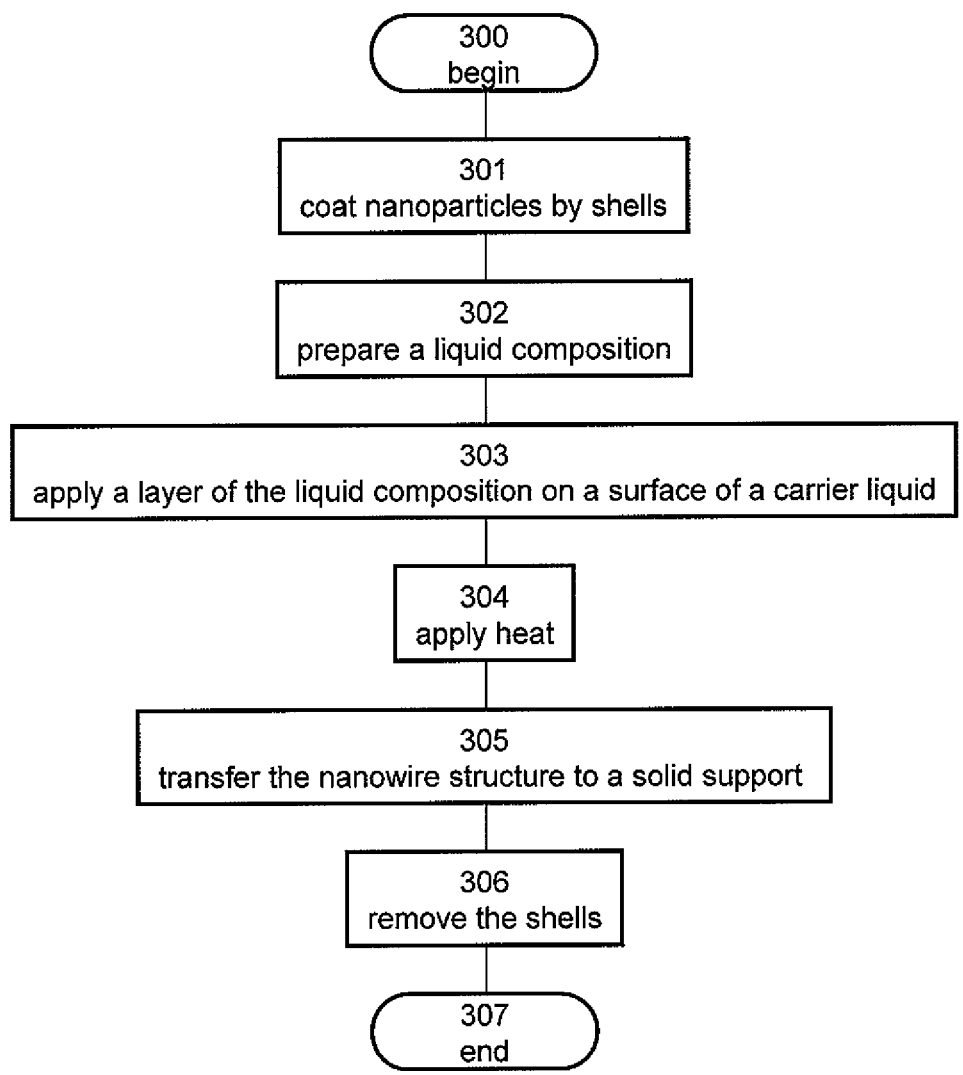
FIG. 3 is a flowchart diagram of a method suitable for forming a nanowire structure, according to various exemplary embodiments of the present invention.

Reference is now made to FIG. 3 which is a flowchart diagram of a method suitable for forming a nanowire structure, according to various exemplary embodiments of the present invention. The method can be used for forming nanowire structure 12 and/or nanowire circuitry 200 described above.

It is to be understood that, unless otherwise defined, the operations described hereinbelow can be executed either contemporaneously or sequentially in many combinations or orders of execution. Specifically, the ordering of the flowchart diagram is not to be considered as limiting. For example, two or more operations, appearing in the following description or in the flowchart diagram in a particular order, can be executed in a different order (e.g., a reverse order) or substantially contemporaneously. Additionally, several operations described below are optional and may not be executed.

The method begins at 300 and optionally and preferably continues to 301 at which nanoparticles are coated by shells to provide a plurality of nanostructures each having a core at least partially enclosed by a shell.

The shells may be "complete", indicating that the shell substantially completely surrounds the outer surface of the core (e.g., substantially all surface molecules or atoms of the core are covered with shell material). Alternatively, the shell may be "incomplete" such that the shell partially surrounds the outer surface of the core (e.g., partial coverage of the surface core molecules or atoms is achieved). In addition, it is possible to create shells of a variety of thicknesses, which can be defined in terms of the number of "monolayers" of shell material that are bound to each core. A "monolayer" is a term known in the art referring to a single complete coating of a shell material (with no additional material added beyond complete coverage). Incomplete monolayers may be either homogeneous or inhomogeneous, forming islands or clumps of shell material on the surface of the core. Shells may be either uniform or nonuniform in thickness. In the case of a shell having nonuniform thickness, it is possible to have an "incomplete shell" that contains more than one monolayer of shell material.

The source nanoparticles used at 301 can be made of a metal, a semiconductor material, a dielectric material, a ferromagnetic material, a thermoelectric material or any other material such as the materials described above in the context of nanoparticles 16. The source nanoparticles used at 301 can have characteristic shape such as the shapes described above in the context of nanoparticles 16.

Thus, in some embodiments of the invention, nanoparticles 16 serve as the core for the core-shell nanostructures prepared at 301. In some embodiments of the present embodiments the source nanoparticles used at 301 can have a core-shell structure before 301 is executed. In these embodiments, outcome of a 301 is a plurality of onion-like structures each having a core and two or more shells (e.g., concentric shells of different diameters). In any event, the shell formed at 301 is the outermost shell of the nanostructure. In some embodiments of the present invention the shells are hydrophobic, and in some embodiments of the present invention the shells are amphiphilic. Representative examples of shells suitable for the present embodiments are provided hereinunder.

The method optionally continues to 302 at which a liquid composition is prepared.

The liquid composition can be prepared by mixing the nanostructures with a surfactant.

As used herein, the term "surfactant" describes a substance that accumulates on a liquid surface and changes the surface properties at the interface of the liquid and an adjacent gas such as air. In some embodiments, the surfactant is an amphiphilic compound that is capable of forming a layer on a surface of an aqueous solution. Such an amphiphilic compound typically has a hydrophobic moiety that includes, preferably terminates with, a hydrophilic group. An example is a fatty acid.

In various exemplary embodiments of the invention the liquid composition is prepared by mixing the nanostructures with a fatty acid. The fatty acid is preferably, but not necessarily, an unsaturated fatty acid, such as, but not limited to, a monounsaturated fatty acid. Representative examples of fatty acids suitable for the present embodiments are provided hereinunder. In various exemplary embodiments of the invention the liquid composition is diluted with an organic solvent, e.g., chloroform or the like.

At 303 a layer of the liquid composition is applied on a surface interfacing between a carrier liquid and a gas. In various exemplary embodiments of the invention the carrier liquid is an aqueous solution or water, and the gas is air. The layer can be a Langmuir monolayer, and the application of the layer on the surface can be done using a Langmuir trough.

At 304 the liquid composition and/or carrier liquid is heated to a temperature selected such that the nanostructures are segregated from the surfactant and assemble into a nanowire structure on the surface. The present inventors discovered that there is a temperature window at which the interactions between the shell and the surfactant results in formation of nanowire structure at the liquid/gas interface. At temperatures below the temperature window, the nanoparticles are distributed within the layer of liquid composition, substantially uniformly. As the temperature increases, the nanostructures are self-assembled into domains, and subsequently are compressed into nanowire structures by the expansion of the molecules of the surfactant in the layer.

Generally, a monolayer on a liquid/gas interface can be characterized by several phases. When the molecules forming the monolayer are spread on the surface of the carrier liquid, they are very loosely packed and form a two-dimensional "gas phase". The area on the carrier liquid available for each molecule is large and the surface pressure is low. When the surface pressure is increased at constant temperature, one or more phase transitions may occur. The first phase transition is from the "gas-phase" to a "liquid-expanded" phase. With further increment of pressure, the monolayer experiences another phase transition, to a phase known as "liquid-condensed" phase, in which the molecules are in a close packed state. Further increment of pressure leads to the collapse of the monolayer due to mechanical instability.

In various exemplary embodiments of the invention the layer of liquid composition is in a liquid-expanded phase. The heating is preferably executed while maintaining a low surface pressure (e.g., less than 1 mN/m or less than 0.1 mN/m or even zero) of the layer.

The heating is preferably to a temperature which is selected such that the segregation and assembling of the nanostructures is reversible. Namely, the heating is preferably to such a temperature that if the layer is allowed to cool down from this temperature, the nanostructures restore their substantially uniform distribution within the layer.

In various exemplary embodiments of the invention the heating is to a temperature T which is higher than a threshold temperature $T_0$. The threshold temperature $T_0$ can be defined as a minimal temperature at which there is no phase transition from a liquid-expanded phase to a liquid-condensed phase anywhere on the layer for any surface pressure of the layer. In some embodiments of the present invention the difference between T and the threshold temperature $T_0$ is less than 5° C., or less than 4° C. or less than 3° C. or less than 2° C. e.g., about 1° C. or less.

The temperature can be increased by any heating technique known in the art, e.g., using a resistive heater and/or laser radiation. The use of laser radiation is preferred from the standpoint of better control on the amount and location of heat delivered to the layer. When a laser radiation is employed, the radiation is preferably emitted directly to the layer.

The laser device used for heating may have a sufficiently small spot size such as to allow scanning the layer by the laser radiation along a predetermined pattern, so as to locally heat the layer along the pattern and to shape the nanowire structure according to the pattern. Preferred spot size of the laser for this embodiment is half a micron or less. Laser scan is also useful for forming a circuitry of nanowire structures supported by the surface of the carrier liquid. In this embodiment the layer is scanned by the laser radiation along a predetermined pattern so as to locally heat the layer along the pattern and to form a circuitry of nanowire structures according to the pattern.

In some embodiments of the present invention the method continues to 305 at which the nanowire structure is transferred from the surface of the carrier liquid to a solid support, such as glass, silicon, semiconductor substrates, electronic chips, printed circuit boards, quartz substrates, mica, insulator substrates and the like. The nanowire structure can be transferred by any technique known in the art. For example, In some embodiments of the present invention a Langmuir-Schaefer horizontal deposition technique is employed. In this technique a solid substrate is descended horizontally onto the layer. Once a contact is made between the nanowire structure or nanowire structures and the substrate, the substrate is extracted with the nanowire structure(s) on it.

Optionally and preferably, the method proceeds to 306 at which the nanowire structure is treated so as to remove the shells from the nanostructures. This can be done by any technique known in the art, such as, but not limited to, plasma etching procedure. For example, ultraviolet ozone cleaning can be employed to eliminate the shell and expose the underlying surface of the nanostructures.

The method ends at 307.

The shell of the nanostructures used by the method of the present embodiments can be in the form of a thin hydrophobic layer (e.g., a hydrophobic monolayer). Generally, the type of shell is selected compatible with the type of core nanoparticles. For example, the shell can include organic molecules comprised of a hydrocarbon chain or chains, and one or more of a thiol, a disulfide, an amine or a carboxylic head group.

As used herein, the phrase "hydrocarbon chain" describes a chain of carbon atoms that are covalently attached therebetween and are substituted by hydrogen atoms. The hydrocarbon chain can be linear or branched, saturated or unsaturated chain and therefore can be in the form of alkylene chains that are optionally interrupted or substituted by, for example, one or more aryl groups. The hydrocarbon chain can include at least 4 carbon atoms, at least 6 carbon atoms, at least 8 carbon atoms, at least 10 carbon atoms, at least 12 carbon atoms or more, e.g., 13, 14, 15, 16, 17, 18, 19, 20 or more carbon atoms.

The hydrocarbon chain can incorporate, be substituted or be terminated with a functional group that can interact with the nanoparticle.

In some embodiments of the present invention the shell is made of thiol-terminated organic molecules. This embodiment is particularly useful, for example, when the nanoparticles are made of gold so as to take advantage of the reaction between thiol and gold. A representative example of thiol-terminated organic molecules suitable for the present embodiments includes, without limitation, alkanethiol, such as, but not limited to, dodecanethiol and octanethiol.

In some embodiments of the present invention, the shell is made of amine-containing organic molecules. A representative example of an amine-containing molecule suitable for the present embodiments includes, without limitation, dodecylamine.

Also contemplated are molecules that combine an end group containing a disulfide (e.g., lipoic acid) and an alkyl chain. Further contemplated are tetradecylammonium bromide, tetraoctylammonium bromide and resorcinarenes that have multiple alkyl groups and thiol groups. The shell can also include any mixture of the aforementioned molecules.

The attachment of molecules that impart a hydrophobic or amphiphilic nature to the surface of the particles can be done by any technique known in the art. For example, when the dodecanthiol is used, the attachment can be according to the procedure disclosed in Brust et al. J. Chem. Soc., Chem. Commun. 1994, 801.

The surfactant of the liquid composition used by the method of the present embodiments can be selected in accordance with the type of nanostructures and the conditions at which the method operations are executed.

In some embodiments of the present invention, the surfactant is a fatty acid. In various exemplary embodiments of the invention the fatty acid and shell are selected such that the threshold temperature $T_0$ is from about 5 degrees centigrade to about 40 degrees centigrade.

In some embodiments, the fatty acid is selected such that the threshold temperature $T_0$ is such that does not affect the core-shell interaction, the stability and the nature of the nanostrucures.

In some embodiments, the fatty acid is selected capable of forming a monolayered film on the liquid carrier, while at the same time, capable of undergoing segregation from the shell, as detailed hereinabove.

Suitable fatty acids include saturated, monounsaturated and polyunsaturated fatty acids.

Suitable saturated fatty acids include, but are not limited to, relatively short fatty acids, having from 6 to 14 carbon atoms. Representative examples include, but are not limited to, caprylic acid (octanoic acid), capric acid (decanoic acid), lauric acid (dodecanoic acid) and myristic acid (tetradecanoic acid).

Monounsaturated fatty acids can include any fatty acid having from 8 to 30 carbon atoms, preferably from 10 to 24 carbon atoms, preferably from 18 to 22 carbon atoms, and one carbon-carbon double bond. Representative examples include, but are not limited to, palmitoleic acid (9-hexadecanoic acid), oleic acid and elaidic acid (cis- and trans-9-octadecanoic acid, respectively), vaccenic acid (11-octadecanoic acid), gadeloic acid (9-eicosenoic acid) and erucic acid (13-docosenoic acid).

Polyunsaturated fatty acids can include fatty acids having from 18 to 30 carbon atoms, and two or more carbon-carbon double bond. Representative examples include, but are not limited to, linoleic acid, alpha-linolenic acid and gamma linolenic acid.

In some embodiments of the invention the fatty acid is elaidic acid, in some embodiments of the present invention the fatty acid is an oleic acid and in some embodiments of the present invention the fatty acid is an erucic acid.

Following are various applications incorporating the nanowire structure or nanowire circuitry of the present embodiments. In any of the embodiments described below, the nanowire structure or nanowire circuitry can be fabricated by the method described above or any other method such as a variant of the described above.

Figure 4A:
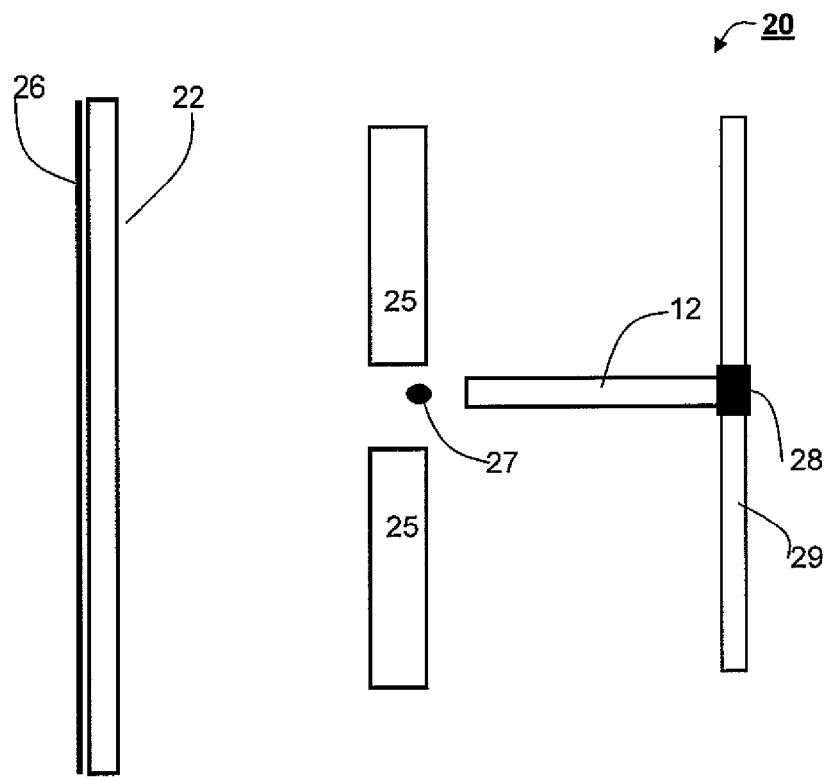
FIG. 4A is a schematic illustration of a field emitter device, according to various exemplary embodiments of the present invention.

Reference is now made to FIG. 4A, which is a schematic illustration of a cross sectional view of a field emitter device 20, according to various exemplary embodiments of the present invention. Device 20 preferably comprises an electrode 22 and a nanowire structure 12. Electrode 22 and nanowire structure 12 are designed and constructed such that when an electrical field is formed therebetween, electrons 27 are extracted from nanowire structure 12 by tunneling through the surface potential barrier. Once emitted from nanowire structure 12, electrons 27 can be accelerated, redirected and focused so as to energetically excite atoms of a specific material, as further detailed hereinunder.

Figure 4B:
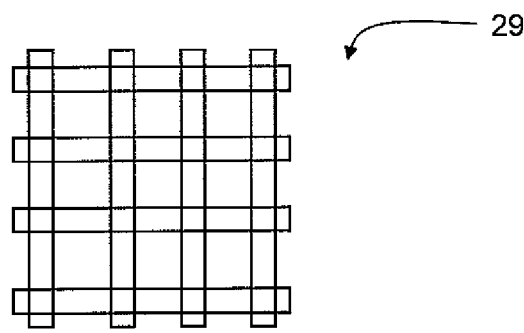
FIG. 4B is a schematic illustration of a matrix of row and column electrodes, according to various exemplary embodiments of the present invention.

Device 20 may be integrated in many apparatus, such as, but not limited to, a field emitter display. In this embodiment, a plurality of nanowire structures may be positioned in cross points 28 of a matrix 29 of electrodes. Matrix 29, better illustrated in FIG. 4B, is formed of a plurality of row and column electrodes. Thus, each cross point 28 can be addressed by signaling the respective row and column electrodes. Upon a suitable signal, addressed to a specific cross point, the respective bundle of nanowire structures 12 emits electrons, in accordance with the above principle.

Device 20 (or the apparatus in which device 20 is employed) may further comprise a substrate 26 having a fluorescent powder coating, capable of emitting light upon activation by the electrons. The fluorescent powder coating may be either monochromatic or multichromatic. Multichromatic fluorescent powder may be, for example, such that is capable of emitting red, green and blue light, so that the combination of these colors provides the viewer with a color image. Device 20 may further comprise a focusing element 25 for ensuring that electrons 27 strike electrode 22 at a predetermined location.

A special use of field emitter device, such as device 20, is in the area of electron beam lithography, in particular when it is desired to achieve a precise critical dimension of order of a few tens of nanometers. The present embodiments successfully provide an apparatus for electron emission lithography apparatus, generally referred to herein as apparatus 30. As further detailed hereinbelow, apparatus 30 is capable of transferring a pattern of a mask in a nanoscale resolution.

Figure 5:
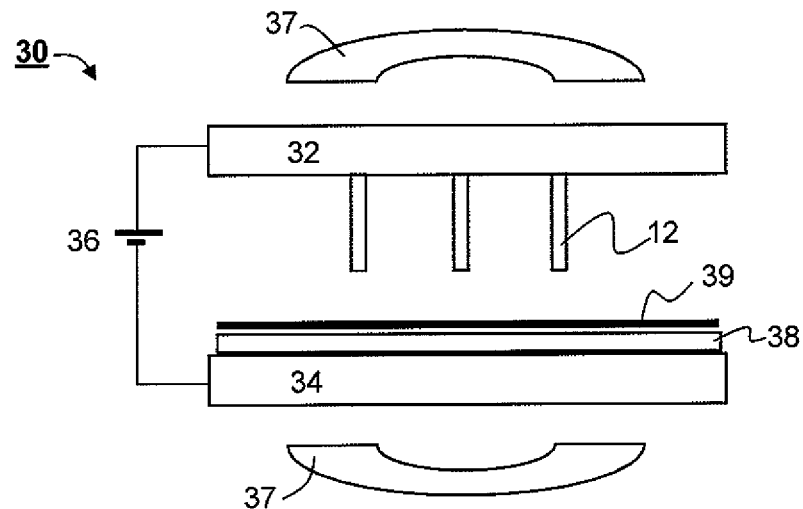
FIG. 5 is a schematic illustration of an apparatus for electron emission lithography, according to various exemplary embodiments of the present invention.

Reference is now made to FIG. 5, which is a schematic illustration of apparatus 30. Apparatus 30 comprises an electron emission source 32 and an electrically conducting mounting device 34. According to various exemplary embodiments of the present invention, sources 32 includes one or more nanowire structures 12. Source 32 and mounting device 34 are kept at a potential difference, e.g., via a voltage source 36. The potential difference is selected such that electrons are emitted from source 32 (similarly to device 20).

A sample 38, on which an e-beam resist 39 to be patterned is formed, is disposed on mounting device 34, in a predetermined distance apart from a source 32. The electrons emitted from nanowire structure 12 perform a lithography process on a sample 38 mounted thereon. Subsequently, if a developing process is performed, portions of resist 39 which were exposed to the emitted electrons remain when the resist 39 is negative, while portions of resist 39 not exposed to an electron beam remain when resist 39 is positive.

Source 32 and mounting device 34 are preferably positioned in a magnetic field generated by a magnetic field generator 37. Magnetic field generator 37 is designed to precisely control a magnetic field according to the distance between nanowire structures 12 and resist 39, so that the electrons emitted from nanowire structure 12 reach the desired positions on resist 39. Being charged particles moving in a magnetic field, the electrons are subjected to a magnetic force, perpendicular to their direction of motion (and to the direction of the magnetic field vector). Thus, a track of the movement of the electrons is controlled by magnetic field generator 37, which redirects the electron to the desirable position.

Consequently, the shape of nanowire structures 12 can be projected upon sample 38 to thereby perform a lithographic process thereon. As described above, according to the present embodiments, since nanowire structures 12 are used as electron emission sources, a lithography process can be performed with a precise critical dimension. In addition, since electrons emitted from nanowire structures 12 carbon depreciate portions of resist 39 corresponding to nanowire structure 12, a deviation between the center of a substrate and the edge thereof are substantially prevented.

An additional use of the nanowire structure of the present embodiments is in the field of information storage and retrieving. In certain embodiments, further detailed hereinunder, switching may be achieved based on the observation that the conductance of semiconductor nanowire structures can change significantly upon either a gate or bias voltage pulse when the surface of the nanowire structures are appropriately modified, for example, with molecules, functional groups or nanocrystals. Other properties of the nanowire structure may also be used to record memory, for example, but not limited to, the redox state of the nanowire structure, mechanical changes, magnetic changes, induction from a nearby field source, and the like.

Specifically, with respect to changes in conductance, subjection to positive or negative gate or bias voltage pulses may cause the change of charge states in the molecules or nanocrystals, and induces the device to make a fully reversible transition between low and high resistance states. The different states may hysterically persist in the set state, even after the voltage source is deactivated. This feature (change in electrical properties upon voltage pulse) may enable the fabrication of electrically erasable and rewritable memory switching devices in which the reversible states are indicated by the conductance of the nanowire structures. In addition, the memory switching devices may be assembled specifically from nanoscale material building blocks, and may not be created in planar materials by lithography.

Figure 6A:
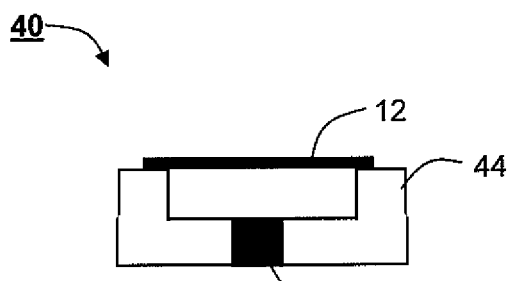
FIGS. 6A-B are schematic illustrations of a memory cell, according to various exemplary embodiments of the present invention.
Figure 6B:
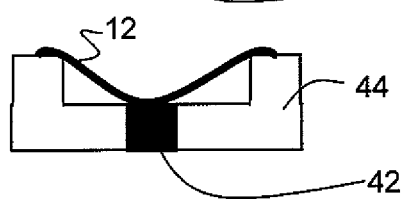

Reference is now made to FIGS. 6A-B, which are schematic illustration of a memory cell, generally referred to herein as cell 40. In its simplest configuration, cell 40 comprises an electrode 42 and a nanowire structure 12. Nanowire structure 12 is preferably capable of assuming one of at least two states. For example, in some embodiments of the present invention nanowire structure 12 deflects when the Euler buckling force is exceeded. Thus, a first state of nanowire structure 12 can be a non-deflected state (when an external force applied on nanostructure is below Euler buckling force) and a second state of nanowire structure 12 can be a deflected state (when the external force is above or equals the Euler buckling force).

Nanowire structure 12 can be suspended by one or more supports 44 over electrode 42. Nanowire structure 12 may be held in position on support(s) 44 in more than one way. For example, in some embodiments of the present invention nanowire structure 12 is held in position on support(s) 44 by anchoring nanowire structure 12 to support(s) 44. The holding of nanowire structure 12 in its place on support(s) 44 can also be facilitated by chemical interactions between nanowire structure 12 and support(s) 44, which chemical interactions include, but are no limited to, covalent bonding.

Electrode 42, nanowire structure 12 and the distance therebetween are preferably selected such that electrical current flowing through electrode 42 and/or nanowire structure 12, generates an electric force on nanowire structure 12 which is larger than the Euler buckling force. Thus, temporarily electric current(s) transform nanowire structure 12 from the first state (FIG. 6A) to the second state (FIG. 6B).

A plurality of cells like cell 40 can be incorporated to provide an electromechanical memory array. Each cell in the array can be in either a first state or a second state thus can store a binary information of a first type of datum (say, "0") and a second type of datum (say, "1"). As the size of nanowire structure 12 is in the nanometric scale, many such cells can be integrated in a single array so that the information storage capacity of the entire array is substantially larger, or at least equivalent to modern memory devices. Each cell may be read or written by applying currents and or voltages to electrode 42 or nanowire structure 12.

More specifically, when nanowire structure 12 is in a non-deflected state (FIG. 6A), cell 40 is characterized by an open circuit, which may be sensed as such on either nanowire structure 12 or trace electrode 42 when so addressed. When nanowire structure 12 is in a deflected state (FIG. 6B), cell 40 is characterized by a rectified junction (e.g., Schottky or PN), which may be sensed as such on either nanowire structure 12 or trace electrode 42 when so addressed.

As will be appreciated by one ordinarily skilled in the art, cell 40 (and therefore an integrated array of a plurality of such cells) is characterized by a high ratio of resistance between "0" and "1" states. Switching between these states is accomplished by the application of specific voltages across nanowire structure 12 or electrode 42. For example, "readout current" can be applied so that the voltage across a respective junction is determined with a "sense amplifier." It will be appreciated that such reads are non-destructive. More specifically, unlike DRAM systems, where write-back operations are required after each read, cell 40 retains its state even once read is performed.

The nanoparticles forming the nanowire structure of the present embodiments can also have magnetic properties, hence to form a magnetic nanowire structure. A plurality of such magnetic nanowire structures can be used as a memory cell, which operates according to magnetic principles.

Figure 7:
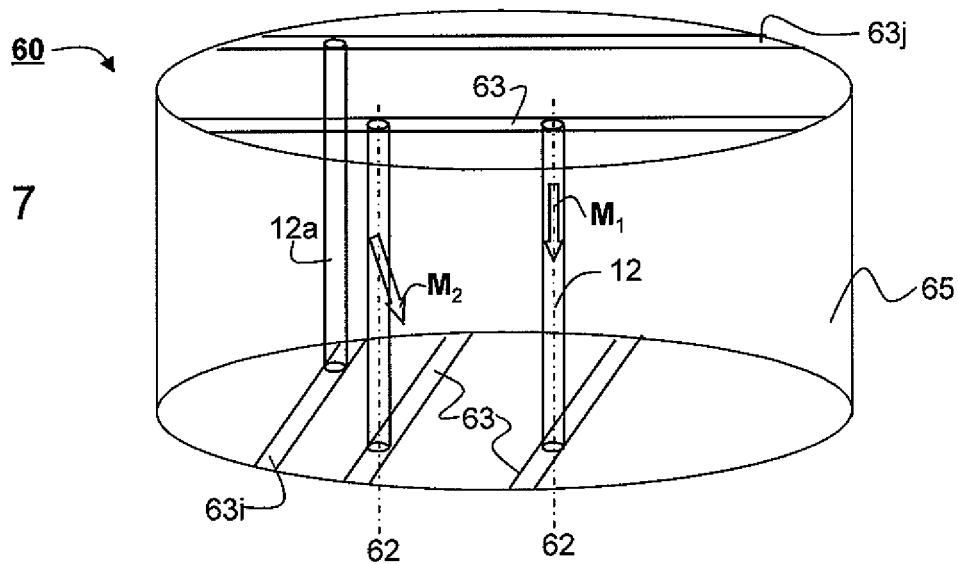
FIG. 7 is a schematic illustration of a memory cell, based on magnetic nanowires, according to various exemplary embodiments of the present invention.

Reference is now made to FIG. 7, which is a schematic illustration of a memory cell, generally referred to herein as cell 60. Cell 60 comprises a plurality of nanowire structures 12 having ferromagnetic properties. Nanowire structures 12 are capable of assuming two magnetization states. One magnetization state (designated $M_1$ in FIG. 7) may be defined, for example, when the magnetization vector, M, is substantially parallel to a longitudinal axis 62 of nanowire structures 12 and another magnetization state (designated $M_2$ in FIG. 7) may be when the magnetization vector has a non-negligible angle (say, above 10°) with respect to axis 62.

Thus, binary information can be stored by the two magnetization states of nanowire structures 12. For example, state $M_1$ can be defined as "0" and state $M_2$ can be defined as "1". One ordinarily skilled in the art would appreciate that well separated magnetization states, also known as a magnetization jump, can be obtained and reproduced precisely from one nanowire structure to the other by working with nanowire structures of ferromagnetic materials. The jump from one magnetization state to the other is preferably identified by sweeping an external magnetic field, so that when its magnitude is below a proper threshold, characteristic to the ferromagnetic material and structure of nanowire structures 12, nanowire structures 12 assumes the first magnetization state and when the magnitude of the external magnetic field magnitude is above the characteristic threshold, nanowire structures 12 assumes the second magnetization state.

Cell 60 further comprises a plurality of conductive lines 63, which may be arranged on opposite sides of a membrane 65, such that each nanowire structure is connected to two conductive lines. This allows for a unique address, represented by a pair of gridwise numbers, to be assigned to each individual nanowire. For example, referring to FIG. 7, nanowire structure 12a, which is connected to conductive lines 63i and 63j is represented by the address (63i,63j).

The operation of cell 60 is based upon a physical effect known as the anisotropic magnetoresistance effect, according to which a component of the electrical resistance of a magnetic element varies with a change in the magnetization orientation of the element and the sensing current flowing therethrough. The change in the electrical resistance depends on the angle between the magnetization vector and the electrical current. Specific methods of writing and reading information into and out of cell 60 can be found, for example, in U.S. Pat. No. 6,172,902 the contents of which are hereby incorporated by reference.

Generally, the writing processes to a given address, say, address (63i,63j), is preferably done by injecting a pulsed current into the respective pair of conductive lines, when the magnitude of the external magnetic field is lower by an amount of $\Delta H$ than the characteristic threshold $H_s$. The result of the pulse is to induce the jump from the magnetic state "0" to state "1". The reading process at a given address is preferably done by injecting a current and measuring the potential between the respective pair of conductive lines at a value of the external magnetic field which is between $H_s - \Delta H$ and $H_s$. Due to the magnetoresistive property of nanowire structure 12, the value of the electric potential is shifted.

Figure 8A:
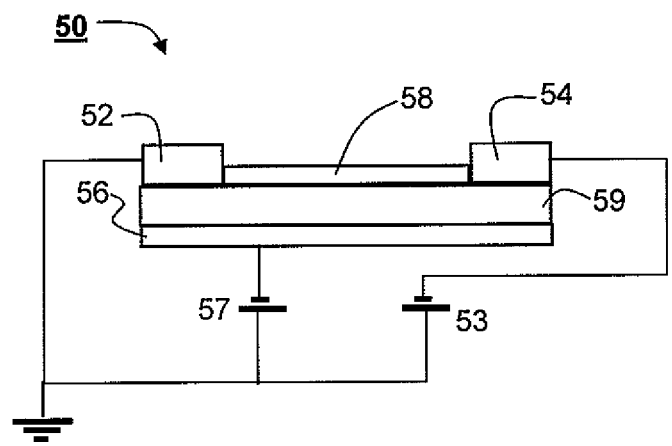
FIG. 8A is a schematic illustration of an electronic device for switching, inverting or amplifying, according to various exemplary embodiments of the present invention.

Reference is now made to FIG. 8A, which is a schematic illustration of an electronic device 50 which can be used for switching, inverting or amplifying, according to various exemplary embodiments of the present invention. Device 50 comprises a source electrode 52, a drain electrode 54, a gate electrode 56 and a channel 58. One or both of gate electrode 56 and channel 58 may be formed of a nanowire structure made of a semiconductor material as further detailed hereinabove. For example, in one embodiment channel 58 is a nanowire structure and gate electrode 56 is preferably layer of $SiO_2$ in a silicon wafer.

Device 50 can operate as a transistor, for example, a field effect transistor. Channel 58 has semiconducting properties (either n-type or p-type semiconducting properties) such that the density of charge carriers can be varied. A voltage 57 is applied to channel 58 through gate electrode 56, which is preferably separated from channel 58 by an insulating layer 59. When the voltage of gate electrode 56 is zero, channel 58 does not contain any free charge carriers and is essentially an insulator. As voltage 57 is increased, the electric field caused thereby attracts electrons (or more generally, charge carriers) from source electrode 52 and drain electrode 54, and channel 58 becomes conducting.

Thus, device 50 serves as an amplifier or a switching device in which, voltage 57 of gate electrode 56 controls the current flowing between source electrode 52 and drain electrode 54 when a bias voltage 53 is applied therebetween.

Figure 8B:
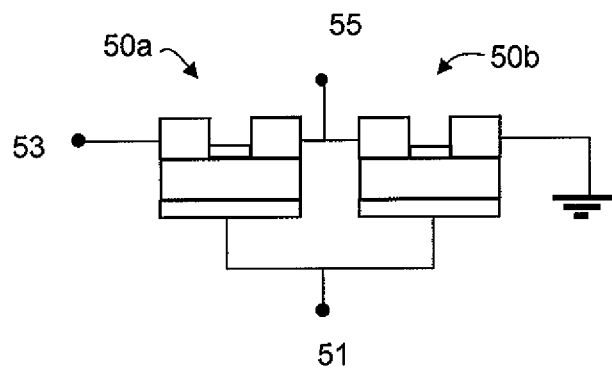
FIG. 8B is a schematic illustration of an inverter, according to various exemplary embodiments of the present invention.

Two devices like devices 50 may be combined so as to construct an inverter. Referring to FIG. 8B, in this embodiment, a first such device (designated 50a) may include a channel having an n-type semiconducting properties and a second such device (designated 50b) may include a channel having a p-type semiconducting properties. Devices 50a and 50b are preferably connected such that when bias voltage 53 is applied between the source of device 50a and the drain of device 50b, the combined device serves as an inverter between input signal 51 and output signal 55.

Figure 9A:
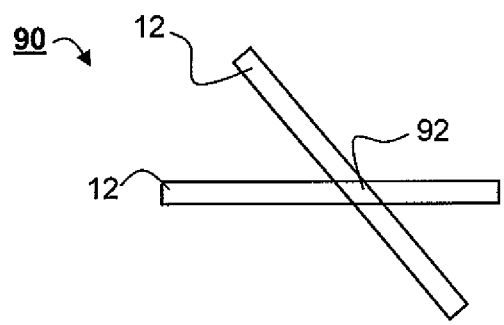
FIG. 9A is a schematic illustration of a transistor, formed of two nanowires, according to various exemplary embodiments of the present invention.

An additional configuration which includes semiconducting nanowire structure is illustrated in FIG. 9A. In this embodiment, two nanowire structures 12 forming a junction 92 can serve as a transistor 90. Preferably, the semiconductor material of one of the two nanowire structures has an n-type doping and the semiconductor material of the other nanowire structure has a p-type doping.

In accordance with the present embodiments, one or both of nanowire structures 12 of transistor 90, has a modulation-doped semiconductor material. One of nanowire structures 12 comprises the source and the drain portions of transistor 90 and the other nanowire structure induces the gate function at junction 92. Both pnp and npn transistors that are analogous to bipolar transistors may be formed in this fashion.

Several junctions like junction 92 can be allocated to form a crossbar array 94, which can be used for signal routing and communications between two layers of nanowire structures. According to some embodiments of the present invention crossbar array 94 comprises a two-dimensional array of a plurality of junctions similar to junction 92. Each junction servers as a switch which can be either singly configurable or reconfigurable and self-assembling. In one embodiment, at least one of the junctions is a quantum state molecular switch having an electrically adjustable tunnel junction between the respective two nanowire structures. The switches, formed at each junction, can be electrochemically oxidized or reduced. Oxidation or reduction of the molecule forms the basis of a switch. Oxidation or reduction affects the tunneling distance or the tunneling barrier height between the two nanowire structures, thereby exponentially altering the rate of charge transport across the junction.

Figure 9B:
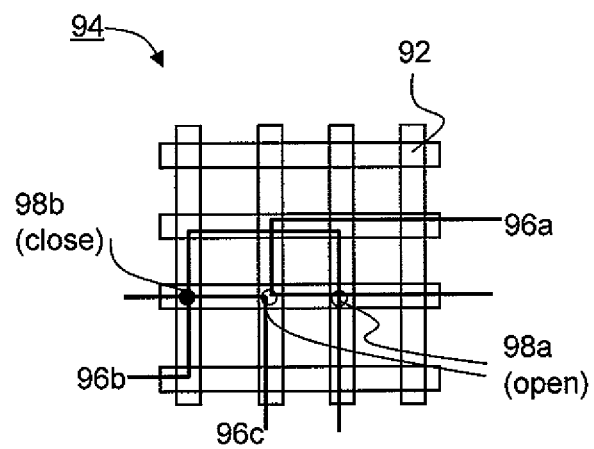
FIG. 9B is a schematic illustration of an array of junctions, each defined between two nanowires, according to various exemplary embodiments of the present invention.

Reference is now made to FIG. 9B which is a simplified illustration of array 94. Array 94 comprises a plurality of junctions 92 defined when two nanowire structures 12 are crossed at some non-zero angle. Nanowire structures 12 can be made of a conductor or semiconductor material as further detailed hereinabove. When an appropriate voltage is applied across the nanowire structures, molecules of each of the two nanowire structures at the junction point are either oxidized or reduced. When a molecule of one nanowire structure is oxidized, a molecule of the other nanowire structure is reduced so that charge is balanced. These two species are referred to herein as a redox pair.

Distinct electrical circuits 96a and 96b and 96c may be created in array 94 as part of an integrated circuit. Circuits 96a, 96b and 96c can cross each other without being electrically connected where switches, shown as open circles in FIG. 9B and designated 98a, are open. Alternatively, the nanowire structures may be electrically connected by a closed switch, shown as a filled circle in FIG. 9B and designated 98b. By using the voltage across the electrochemical cell formed by each pair of crossed nanowire structures to make and break electrical connections both along nanowire structures in a layer (segmented wires) and between wires in two layers (vias), one can create an integrated circuit of arbitrarily complex topology. The wires may connect to an external or an internal electronic device (not shown), e.g., a resonant tunneling diode or a transistor.

The conducting nanowire structures of the present embodiments can also serve as conducting interconnects for electronic circuit assembly of multiple layers. Multi-layered electronic assemblies are used to interconnect a large number of circuit layers. A typical multi-layered assembly has several layers of signal lines, separated by interleaving dielectric layers, and via connections running through one or more dielectric layers perpendicular to the layers surface, as required by the specific electric interconnect network of the assembly.

Figure 10:
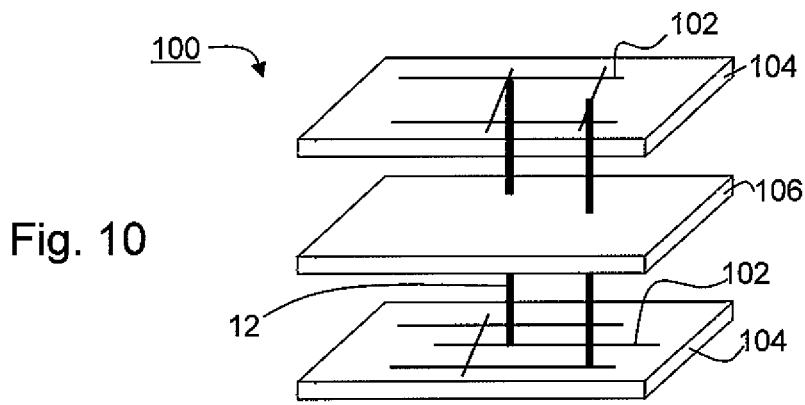
FIG. 10 is a schematic illustration of an electronic circuit assembly, according to various exemplary embodiments of the present invention.

Reference is now made to FIG. 10, which is a simplified illustration of an electronic circuit assembly 100, according to various exemplary embodiments of the present invention. Assembly 100 comprises conductive lines 102 being arranged in at least two layers 104 separated therebetween by a dielectric layer 106. Several conductive lines 102 are electrically connected via one or more conductive nanowire structure 12. Nanowire structures 12 preferably serve as passive conductors for facilitating electrical communication between different layers of assembly 100.

As used herein, the phrase passive conductor referrers to a conductor capable solely to transmit electrical current therethrough.

As used herein, the phrase dynamical conductor referrers to a conductor capable of having to states: a transmissive state in which the conductor serve as a passive conductor and a non-transmissive state in which no electrical current is transmitted therethrough.

It will be appreciated that assembly 100 can be combined also with array 94 or several elements thereof, so that nanowire structures 12 can also be used dynamically. For example, some nanowire structure can serve mealy as vertically conductive lines between different layers (passive conductors), while other nanowire structures may form one or more junctions, similar to junction 92, thus allowing switching (dynamic conductors) as further detailed hereinabove.

An additional application in which the nanowire structures of the present embodiments can be used is in a device for detecting a position and/or movement of an object. Position sensors are used in a variety of modern devices and transducers, for example, in applications for robotics and computer hardware. In robotics, such sensors provide useful information about the state of contact between a robot hand and an object in prehension. In computer-related products such sensors are employed in device such as, but not limited to, mouse, joystick and the like, which respond to movement in two dimensions.

Figures 11A, 11B:
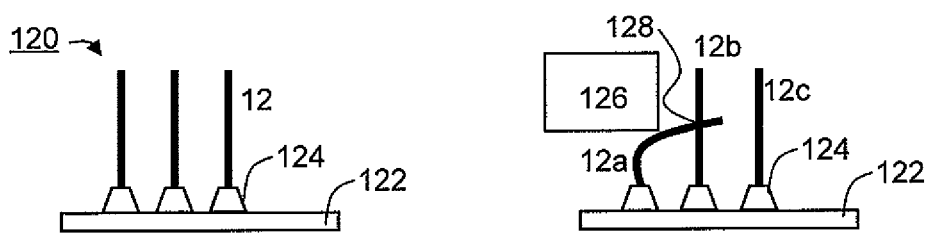
FIGS. 11A and 11B are schematic illustrations of a device for detecting a position and/or movement of an object, according to various exemplary embodiments of the present invention.

Reference is now made to FIG. 11A, which is a simplified illustration of a device for detecting a position and/or movement of an object, generally referred to herein as device 120. Device 120 comprises a plurality of non-intersecting nanowire structures 12, formed of conductor or magnetic material, as further detailed hereinabove. Nanowire structures 12 are connected to an electronic circuitry 122, which may have a flat surface or a macroscopically non-flat surface, e.g., a robot's finger tips. The connection between nanowire structures 12 and circuitry 122 may be via an array of contact pads 124. Each contact pad may be allocated with more than one nanowire structure so as to form a bundle of nanowire structures.

FIG. 11B is a schematic illustration of device 120 when contacted by an object 126. Three nanowire structures are shown in FIG. 11B, designated 12a, 12b and 12c. In operational mode, object 126 contacts nanowire structure 12a and elastically bends it so that nanowire structure 12a intersects nanowire structure 12b which is adjacent thereto. An electrical connection 128 between nanowire structure 12a and nanowire structure 12b is thus made possible. Similarly, when objects 126 continues to move, other intersections occur (e.g., between nanowire structures 12b and 12c).

The location at which object 126 contacts device 120 can thus be detected based on the criterion of electrical connection/no-connection between pairs of contact pads. Device 120 is capable of detecting the position, area, direction of movement, and intensity or strength of the tactile contact (the contact of object 126 with device 120). These factors are generally referred to herein as the position and movement activity of object 126. The position and movement activity can be evaluated by interrogating pairs of contact pads to determine whether an electrical connection has been made between adjacent nanowire structures.

Whether a connection between nanowire structures 12 has been made can be sensed by sending a current pulse to contact pads 124 and measuring the electrical resistance. The location of the object can be determined quantitatively based on the number of nanowire structure being electrically connected at any moment. The time sequence at which the electrical connections are effected provides information on the direction of the motion of object 126. Contact pads 124 can be interrogated sequentially or simultaneously to detect the electrical connection.

The intensity of the tactile force on device 120 may be determined in various ways, such as, but not limited to, evaluation of the physical contact resistance between nanowire structures that are bent and in contact. The value of the electrical resistance between connected depends on the force applied on nanowire structure 12.

The conducting or semiconducting nanowire structures of the present embodiments may also be used in the field of electrophoretic displays. Electrophoretic displays employ a plurality of electrically charged particles suspended in a fluid. Under the influence of electric field, the charged particles move through the fluid hence locally alter the optical characteristics of the display.

Figure 12:
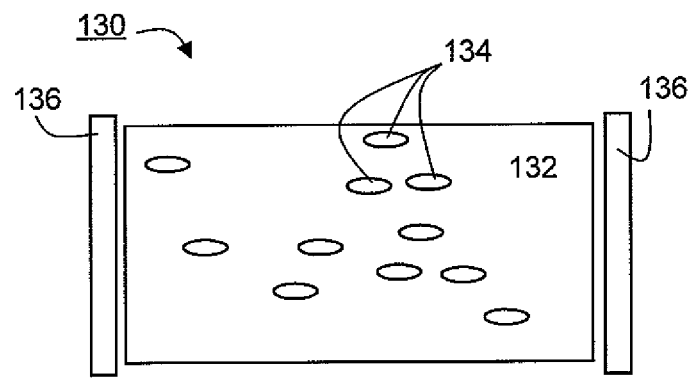
FIG. 12 is a schematic illustration of a display system, according to various exemplary embodiments of the present invention.

Reference is now made to FIG. 12 which is a schematic illustration of a display system 130, according to various exemplary embodiments of the present invention. System 130 comprises a fluid 132 containing a plurality of nanowire structure devices 134, each being formed of a conductor or semiconductor material, as further detailed hereinabove.

Nanowire structure devices 134 are distinguished from the pigment particles used in prior art electrophoretic displays by their size. Pigment particles are typically of the order of several hundred nanometers in diameter, or larger. Thus, the diameters of even the smaller pigment particles are of the same order as the wavelengths of visible light, which vary from about 400 nm for blue light to about 700 nm for red light. It is well known to those skilled in the art that the light scattering power of particles is approximately proportional to the sixth power of the particle diameter for particles having diameters less than the wavelength of the relevant light.

Thus, isolated nanowire structure devices, which are much smaller than the typical wavelength of light do not appreciably scatter the light and, as such, are effectively transparent. However, the nanowire structure devices, when brought into proximity with one another and thus aggregated into larger clusters having diameters comparable to the wavelength of light, scatter light strongly. Thus, by controlling the aggregation level of nanowire structure devices 134, one can determine whether the nanowire structure devices 134 appear transparent or turbid.

System 130 further comprises an electric field generator 136 capable of generating an electric field effective in shifting nanowire structure devices 134 between a dispersed state, corresponding to a first optical characteristic and an aggregated state corresponding to a second optical characteristic.

Conductor nanowire structures, such as nanowire structures made of silver or gold, change color with aggregation. This color change is due to the change in the average refractive index as the aggregates form. When conducting nanowire structure devices aggregate, both the color and the intensity of light scattering increases. In other words, the first and second optical characteristics of the display system comprise different colors. For example dispersions of gold nanowire structure devices are typically ruby red, while aggregates of gold nanowire structure devices vary in color from purple to blue to black depending on the interparticle distance. Thus, in this embodiment, the color of system 130 can be controlled by controlling the degree of aggregation of nanowire structure devices 134.

Semiconducting nanowire structure devices have strong particle size dependent colors in both the dispersed and aggregated states. The colors are best and most easily seen in fluorescence, and are due to the size dependent quantization of electronic levels in nanowire structure devices 134. The smaller the nanowire structure device, the larger the band gap and the shorter the wavelength of the fluorescence. Semiconducting nanowire structure devices have fluorescent peaks that vary smoothly from about 400 nm to about 700 nm (red) when the size of the nanowire structure device varies from about 1.2 nm to about 11.5 nm.

An additional application in which the nanowire structure of the present invention is in the field of thermoelectricity. Thermoelectric devices are devices that either convert heat directly into electricity or transform electrical energy into pumped thermal power for heating or cooling. Such devices are based on thermoelectric effects involving relations between the flow of heat and of electricity through solid bodies.

The formulation of the thermoelectric effect, also known as the Seebeck effect, is as follows. When an open circuit made of a pair of dissimilar metals is held so that two junctions are kept at different temperatures, a potential difference is produced across the terminals of the open circuit. The potential difference is directly proportional to the temperature difference, and does not depend on the distribution of temperature along the metals between the junctions. The factor of proportionality, referred to in the literature as the relative Seebeck coefficient, generally varies with the level of the temperature at which the temperature difference occurs.

The flip side of the Seebeck effect is known as the Peltier effect. According to the Peltier effect a current driven in a circuit made of dissimilar metals causes the different metals to be at different temperatures. Depending on the direction of current flow, heat could be either removed from a junction to freeze water into ice, or by reversing the current heat can be generated to melt ice. The heat absorbed or created at the junction is proportional to the electrical current, and the proportionality constant is known as the Peltier coefficient. The Peltier effect is caused by the fact that an electrical current is accompanied by a heat current in a homogeneous conductor even at constant temperature. The heat current is interchangeably referred to herein as power, as the two quantities have the same physical dimensions (energy per unit time).

The heat current accompanying the electric current, I, is explained by the different flow velocities of the electrons carrying the electric current. The flow velocities depend on the energies of the conduction electrons. For example, if the flow velocity of electrons having an energy above the Fermi energy is higher than for electrons with a lower energy, the electric current is accompanied by a heat current in the opposite direction (since the electronic charge is negative). In this case the Peltier coefficient is negative. Similar situation occurs in an n-doped semiconductor where the electric current is carried by electrons in conduction-band states. Opposite situation (i.e., electrical and heat currents flowing in parallel direction) occurs for a p-doped semiconductor where the electric current is carried by holes.

The operation of thermoelectric devices is based on the Peltier effect. Generally, thermoelectric devices have thermoelectric materials sandwiched between ceramic plates. When the plates have different temperatures (due to the current flowing therebetween) and the heat at the hot plate is dissipated to the ambient environment, this assembly becomes a cooling unit.

Besides the pumping of heat away from the cold plate, there exists two additional thermal processes, which conflict with the Peltier cooling: Joule heating, originating from the electromotive source generating the electrical current, and heat conduction current, flowing from high to low temperatures. The coefficient-of-performance of the cold plate of a thermoelectric device is defined as the ratio of the power at the cold plate, to the total power of the device. The figure-of-merit of the thermoelectric device is defined as $S^2 \sigma T/\kappa$, where S is the Seebeck coefficient, $\sigma$ is the electrical conductivity, T is the temperature and $\kappa$ is the thermal conductivity of the device. An efficient thermoelectric device is characterized by high coefficient-of-performance and high figure-of-merit.

As the Seebeck coefficient, S, and the electrical conductivity, $\sigma$, are competing quantities, any attempt to increase the Seebeck coefficient, results in a decrement of the electrical conductivity. It is therefore appreciated that in conventional materials, a limit to the figure-of-merit is rapidly obtained. Moreover, for a given thermoelectric device, designed for a specific application at a specific range of temperatures, the power of the cold plate and the coefficient-of-performance reach their maximal values at different currents. Practically in conventional thermoelectric devices the current is compromisingly selected in the range between the maximum efficiency and the maximum cooling power.

Hence, the temperature difference between the hot and the cold plates imposes severe limitations on the efficiency of the device. Moreover, even for low temperature differences, in many applications, especially for cooling of small areas, conventional thermoelectric devices are not capable of pumping the required heat fluxes.

The use of low dimensions in the design of thermoelectric devices, is known to have several advantages: (i) enhanced density of states, due to quantum confinement effects, results in an endearment of the Seebeck coefficient without a reduction in the electrical conductivity; and (ii) boundary scattering of electrons or holes reduces the thermal conductivity more than the electrical conductivity, hence further increases the figure-of-merit.

Being practically a one dimension object, the nanowire structure of the present invention can be employed in thermoelectric devices. The thermoelectric devices of the present invention can be used in numerous areas of applications, such as, but not limited to, military, medical, industrial, consumer, scientific/laboratory, electro-optics, computers and telecommunications areas. For example, in communications systems, the thermoelectric devices of the present invention can be used keep power amplifiers of transceivers at operating temperature. In the area of laser devices and, more particularly, semiconductor laser devices, the thermoelectric devices of the present invention can be used for transporting heat away from small areas, thereby to control the operating temperature of the semiconducting laser device. Additionally, the thermoelectric devices of the present invention can be used to stabilize temperature in multiplexed fiberoptics communications systems, where heat generation and thermal management is becoming one of the barriers to further increase clock speeds and decrease feature sizes. Still in addition, the thermoelectric devices of the present invention can be used in microprocessors and digital signal processors, where a very small area of high heat must be removed quickly and efficiently.

Figure 13:
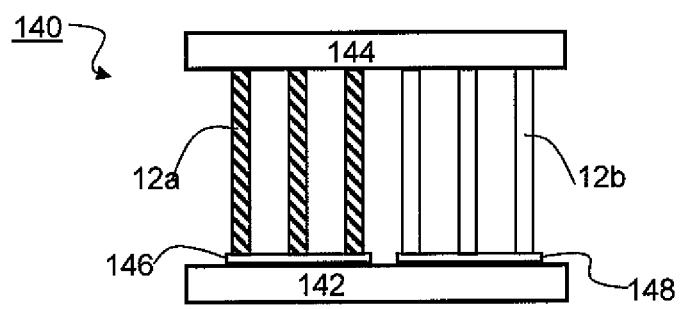
FIG. 13 is a schematic illustration of a thermoelectric device, according to various exemplary embodiments of the present invention.

Reference is now made to FIG. 13 which is a schematic illustration of a thermoelectric device 140, according to various exemplary embodiments of the present invention. Device 140 comprises a first heat conducting layer 142 and a second heat conducting layer 144, where first 142 and second 144 heat conducting layers are interposed by a plurality of nanowire structures 12. Nanowire structures 12 are formed of a thermoelectric material.

It is recognized that the efficiency of thermoelectric device 140 is increased by decreasing the leg diameter to a size at which quantum confinement effects occur. Thus, by using nanowire structures 12 of the present invention, the performance efficiency is substantially increased. More specifically, because the charge carrier mobility in nanowire structures 12 is enhances due to quantum confinement effects present therein, the Seebeck coefficient is increased substantially without a decrease in the conductivity of the device.

According to various exemplary embodiments of the present invention there are two branches of nanowire structures 12, designated 12a and 12b in FIG. 13. Nanowire structures 12a are connected to layer 142 through an electrically conductive layer 146 and nanowire structures 12b are connected to layer 142 through an electrically conductive layer 148. Layer 144 is preferably electrically conductive. Layers 146 and 148 have no electrical communication thereamongst, other than the electrical communication through nanowire structures 12a, nanowire structures 12b and layer 144. Nanowire structures 12a and 12b preferably have opposite doping nature. For example nanowire structures 12a may be p-type semiconductors and nanowire structures 12b may be n-type semiconductors or vice versa.

When current flows from an electromotive source (not shown), free electrons flow through nanowire structures 12b from layer 142 to layer 144, and holes flow through nanowire structures 12a from layer 144 to layer 142. In the following, the operation of the 12b branch of device 140 will be explained. One ordinarily skilled in the art would appreciate that a similar description applies also for the second branch, by reversing the sign of the heat and charge carriers, i.e., by replacing electrons with holes.

In operative mode, layer 142 absorbs heat from the environment. The resulting effect is a heat current flowing anti-parallel to the electrical current generated by the electromotive source. In other words, the heat (or a portion thereof) is carried by the electrons flowing through nanowire structures 12b in the direction of plate 144. During the transition of electrons from plate 142 to nanowire structure 12b, the electrons receive additional energy, sufficient for moving from the Fermi level of free electrons in plate 142 to the conduction band in nanowire structures 12b. This energy is taken from layer 142 by annihilating phonons in its lattice. Thus, energy is pumped away from layer 142.

When the electrons of nanowire structures 12b arrive to layer 144, their kinetic energy is delivered thereto, for example, by producing phonons. Thus, energy, originated from layer 142 is transferred to layer 144. Subsequently, the heat is dissipated to the environment, for example with the aid of a heat sink.

Figure 14:
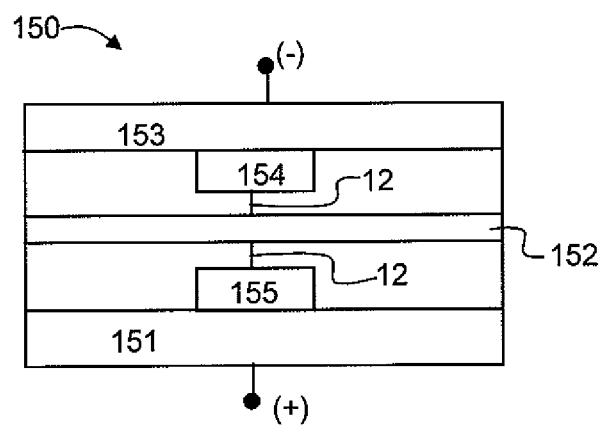
FIG. 14 is a schematic illustration of another thermoelectric device, according to various exemplary embodiments of the present invention.

Reference is now made to FIG. 14, which is a schematic illustration of another thermoelectric device, generally referred to herein as device 150. According to various exemplary embodiments of the present invention device 150 comprises several heat conducting regions. Shown in FIG. 14 are three such regions, designated by numerals 151, 152 and 153. Device 150 further comprises two semiconducting regions 154 and 155, which are connected to regions 151, 152 and 153 via two or more nanowire structures 12. Nanowire structures 12 are formed of a conductor or thermoelectric material.

Regions 151 and 153 are connected to electromotive sources (not shown), and provide current through device 150. Semiconducting regions 154 and 155 have opposite doping nature. For example region 154 may be a p-type semiconductor and region 155 may be an n-type semiconductor or vice versa. Region 152 serves as the cold part of device 150, while regions 151 and 153 serve as the hot parts thereof. When current passes from region 151 to region 153 though regions 154 and 155 and through nanowire structures 12, the Peltier effect causes heat to be transmitted out of region 152. Nanowire structures 12, connecting semiconducting regions 154 and 155 to cold region 152, form quantum cold points. These cold points provide electron confinement and also phonon discontinuity, which limits vibrational energy transfer via the lattice of the materials and hence limits heat transfer from regions 154 and 155 to cold region 152. These effects improve cooling efficiency of the thermoelectric cooling device.

It will be appreciated that the elements of device 150 can, in principle, engage a single plane. In other words, all the components of device 150 can be formed in a lateral orientation, at the same relative height above the substrate onto which they are formed. Such a lateral configuration is easier to fabricate than a top down structure in forming the points because the shape can be precisely controlled.

One of the advantages of the present invention is that the principles of devices 140 or 150 may be exploited for many applications. For example, several thermoelectric devices may be arranged to form a thermoelectric system capable of pumping more heat than a single device. Being preferably small sized, many thermoelectric devices can be efficiently packed into a relatively compact thermoelectric system. In addition, one or more thermoelectric devices (e.g., a thermoelectric system) may be integrated on an object, such as, but not limited to, an electronic chip, so as to facilitate heat release therefrom.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

The teachings of some embodiments of the present invention were utilized to fabricate a network of nanowire structures. In the present experiments, the liquid carrier was purified water, and the liquid composition was a mixture of elaidic acid and nanostructures. The core of the nanostructures was made of gold and the shell included dodecanethiol.

Materials and Methods

Materials $HAuCl_4$, tetradecylammonium bromide, sodium borohydride, dodecanethiol and elaidic acid were obtained from Sigma-Aldrich (St. Louis, Mo.) and used as obtained. Chloroform and toluene were HPLC grade (Frutarom Ltd.). Elaidic acid was dissolved in chloroform at a final concentration of 2 mM. A molar fraction of 0.2% of gold nanostructures in the liquid composition was achieved by mixing the appropriate quantities of parent solutions of each compound. The water subphase used in the Langmuir trough was doubly purified by a Barnstead D7382 water purification system (Barnstead Thermolyne, Dubuque, Iowa), at a resistivity of 18.3 mΩ.

Preparation of Gold Nanostructures

The procedure for preparing nanostructures having gold core and dodecanethiol shell was a modification of the procedure disclosed in Brust et al., Chem. Soc., Chem. Commun. 1994, 801, as follows. The procedure was based on a two-phase (toluene-water) reduction of $HAuCl_4$ in the presence of stabilizing ligand.

100 mg $HAuCl_4$ were dissolved in 10 ml water and transferred to 40 ml toluene by mixing with 500 mg of tetradecylammonium bromide. A volume of 0.0147 ml of dodecanethiol was added to the solution while stirring vigorously. 200 mg of $NaBH_4$ dissolved in 1 ml of water were added.

After 10 min the solution appeared dark brown, indicating the formation of AuNPs. The solution was stirred overnight to ensure completion of the reaction.

The organic phase was washed with 2M $H_2SO_4$ and water in a separation funnel, and subsequently evaporated in vacuum to near dryness. The resultant gold-dodecanethiol nanostructures were precipitated by addition of ethanol (60 mL).

Subsequently, the nanostructures were washed three times with ethanol and once with 2-propanol and dried in vacuo to yield 34.9 mg of nanostructures as a black wax, which was easily dissolved in chloroform to 3.12 mg/ml. The nanostructures were characterized by ultraviolet-visible spectroscopy and TEM. The average diameter of the particles was approximately 3 nm.

Surface-Pressure/Area Isotherms

Surface-pressure/area isotherms were recorded on a computerized Langmuir trough (model 622/D1, Nima Technology Ltd, Coventry, UK). The surface pressure was monitored using a 1 cm filter paper as a Wilhelmy plate. For each isothermal compression experiment, a desired amount of liquid composition which included a mixture of elaidic acid, nanostructures and chloroform was spread on the water subphase and equilibrated for 15 min, allowing for solvent evaporation prior to compression. Compressions were carried out at a constant barrier speed of 8 square cm per minute.

Formation and Observation of Nanowire Structures

The nanowire structures were formed by irradiating monolayer of the liquid composition on water by a laser source of a Brewster Angle Microscopy (BAM) apparatus (NFT, Gottingen, Germany). The BAM apparatus mounted on a Langmuir film balance so as to observe the formed nanowire structures in situ. The laser source was a frequency-doubled Nd:YAG laser with a wavelength of 532 nm and 50 mW primary output power in a collimated beam.

BAM images were recorded using a CCD camera. The scanner objective was a Nikon superlong working distance objective with a nominal 10×magnification and diffraction-limited lateral resolution of 2 μm. The images were corrected to eliminate side-ratio distortion originating from a non-perpendicular line of vision of the microscope.

BAM images were also acquired following the transfer of the nanowire structures to a solid support.

Transmission Electron Microscopy (TEM)

Films at the desired surface pressures were transferred horizontally onto 400 mesh copper formvar/carbon grids (Electron Microscopy Sciences, Hatfield, Pa., USA) for TEM. TEM images were recorded on a Jeol JEM-1230 TEM (JEOL LTD, Tokyo, Japan) operating at 120 kV.

Results

Figure 15:
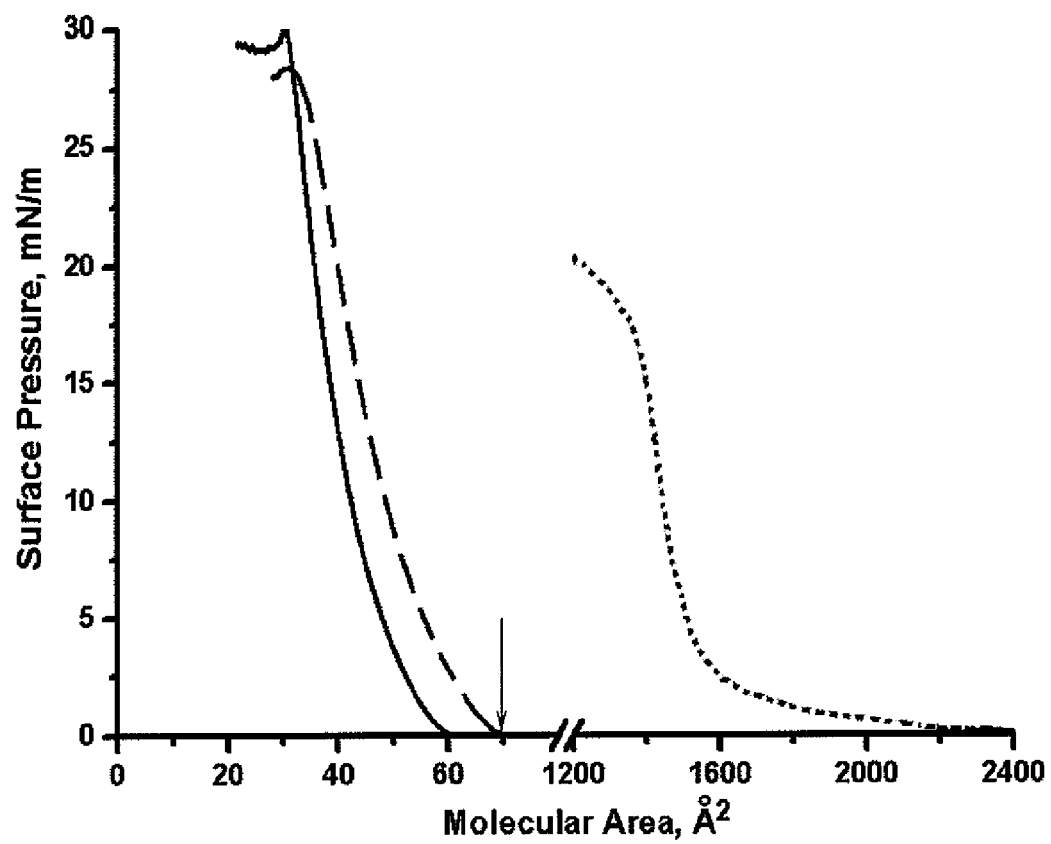
FIG. 15 shows surface-area/pressure isotherms of monolayers of an elaidic acid (solid curve), nanostructures (dotted curve) and a liquid composition which was prepared according to various exemplary embodiments of the present invention from an elaidic acid and nanostructures (dashed curve).

FIG. 15 shows surface-area/pressure isotherms of monolayers immediately following deposition of the monolayers on a water surface at 22° C. Shown in FIG. 15 are isotherms of a pure elaidic acid (solid curve), the nanostructures and (dotted curve) and a liquid composition which comprises the elaidic acid and the nanostructures (dashed curve). As shown, the pure elaidic acid monolayer exhibits a liquid-expanded (LE) phase, and the nanostructures monolayer, on the other hand, exhibits a condensed phase. The compression isotherm of the liquid composition indicates a liquid-expanded monolayer which is similar to pure elaidic acid but is slightly shifted to higher molecular areas due to the presence of the nanostructures.

The monolayer of the liquid composition (elaidic acid and the nanostructures) was further examined, in situ, at a zero mN/m surface pressure (indicated by the arrow in FIG. 15) using BAM. BAM analysis employs a circularly polarized laser to visualize monolayers formed at the air/water interface through the effects of the deposited substances upon the light refracted at the water/monolayer interface.

Figure 16A:
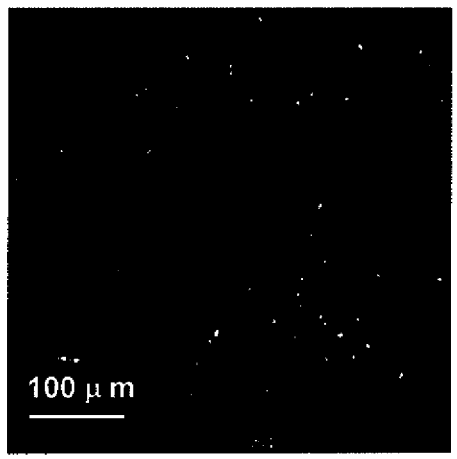
FIGS. 16A-E are brewster angle microscopy (BAM) images of monolayers of a liquid composition as obtained according to various exemplary embodiments of the present invention at a temperature of 22° C. and different laser intensities.
Figure 16B:
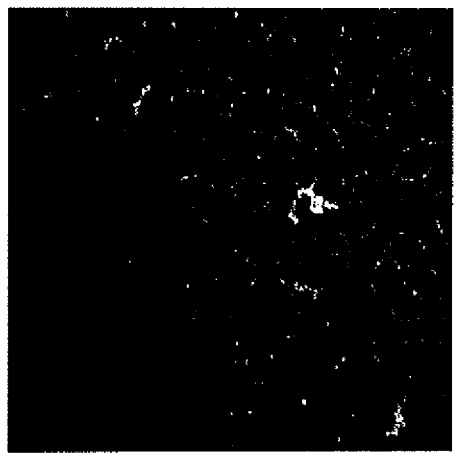
Figure 16C:
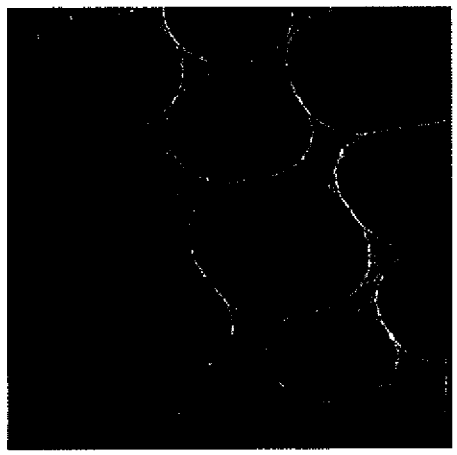
Figure 16D:
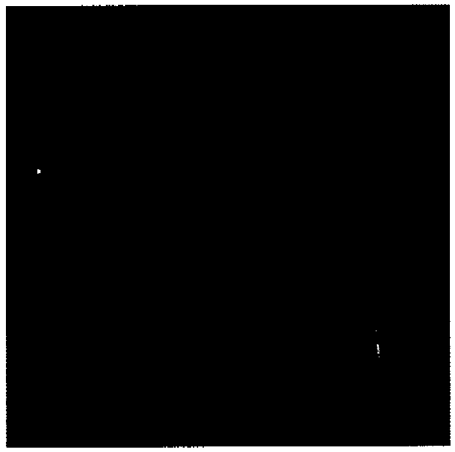

FIGS. 16A-E are BAM images of monolayers of the liquid composition at a temperature of 22° C. and a laser intensity (expressed as percentage of a maximal intensity of 50 mW) of 0% (FIG. 16A), 40% (FIG. 16B), 60% (FIG. 16C), 80% (FIG. 16D), and 90% (FIG. 16D). The scale bar (corresponding to all images) is 100 μm.

Figure 16E:
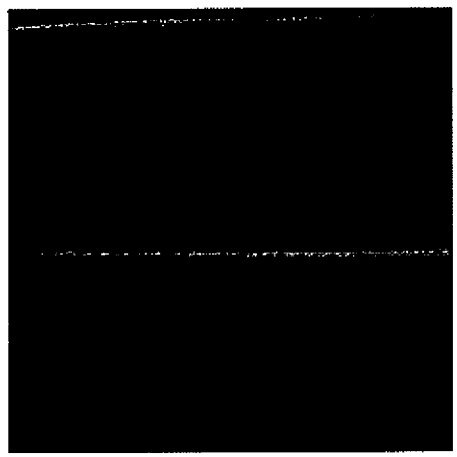

FIGS. 16A-E demonstrate that modulation of the power of the laser beam irradiating the monolayer resulted in modifications of film structure. At a nominally zero laser power (FIG. 16A) the BAM image indicates a rather homogenous monolayer displaying dull reflectance of the nanostructures that are randomly dispersed on the water surface (the image was recorded immediately after switching on the laser beam). Examination of the same mixed monolayer after application of higher laser intensities, reveals a remarkable reorganization of the nanostructures (FIGS. 16B-E). At these intensities, long-range ordering of the gold nanostructures was observed. Specifically, irradiation of the monolayers with more intense lasing for approximately 60 seconds gave rise to an interconnected network of condensed regions of nanostructures (FIGS. 16B and 16C), turning into highly uniform gold nanowire structures, reaching several millimeter in lengths (FIGS. 16D and 16E).

In several experiments, the monolayer was allowed to cool back to 22° C. following the irradiation. In these experiments, the nanostructures restored their random dispersion, demonstrating that the process of segregation and assembling was reversible.

The gold nanowire structures exhibited high stability and were successfully transferred from the water surface onto solid substrates without disrupting the organization of the nanostructures.

Figure 17A:
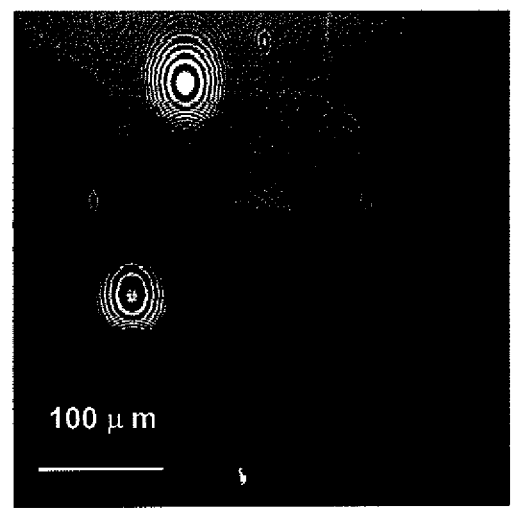
FIGS. 17A-C are BAM images of nanowire structures fabricated according to various exemplary embodiments of the present invention at a temperature of 22° C. and different laser intensities following their transfer to a glass support.
Figure 17B:
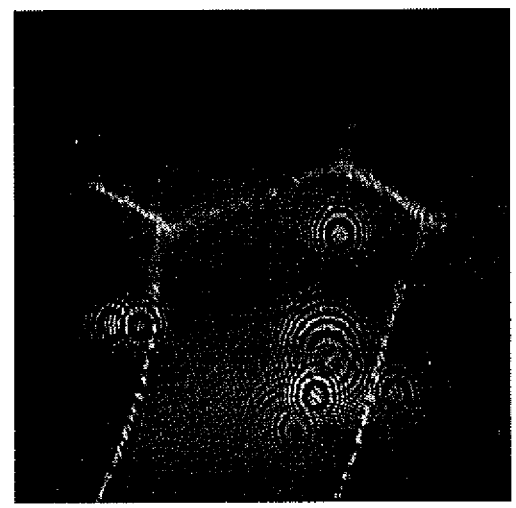
Figure 17C:
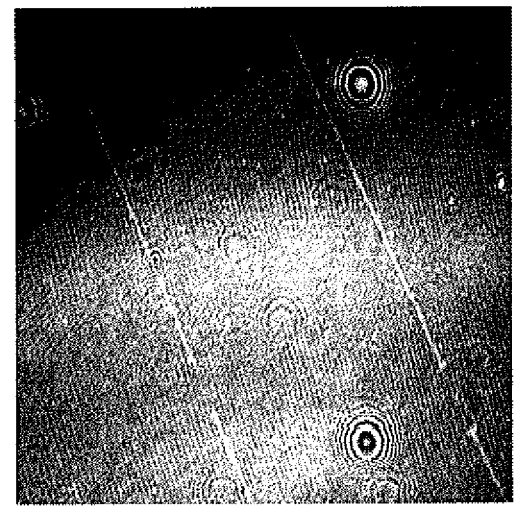

FIGS. 17A-C are BAM images of the nanowire structures following their transfer to glass support. Shown in FIGS. 17A-C are nanowire structures obtained at laser intensity (expressed as percentage of a maximal intensity of 50 mW) of 70% (FIG. 17A), 80% (FIG. 17B) and 90% (FIG. 17C). Scale bar corresponds to 100 μm.

FIGS. 17A-C demonstrate that the same highly-ordered gold nanowire structures were retained following transfer to solid surfaces.

The sub-micron organization of the nanostructures was examined using TEM.

Figure 18A:
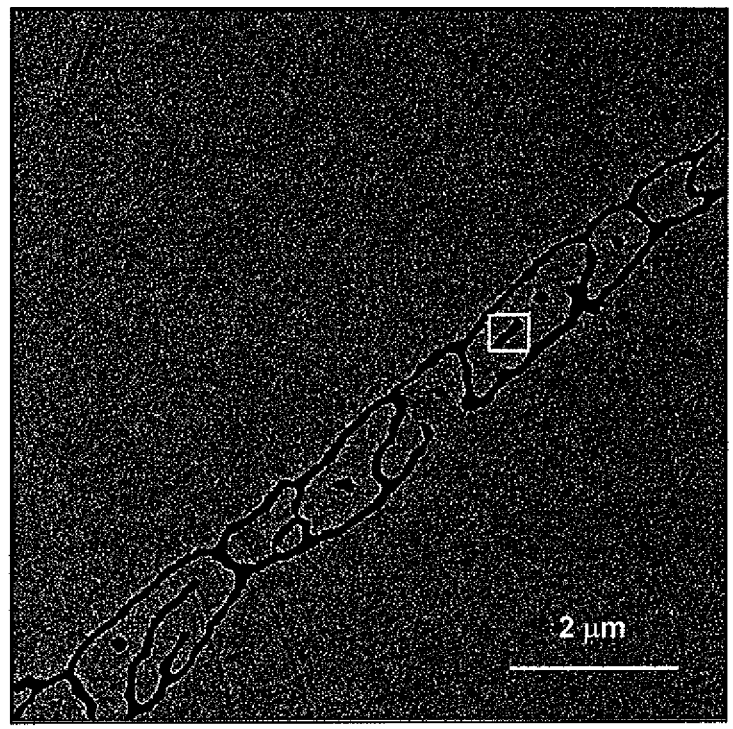
FIGS. 18A and 18B are TEM images of gold nanowire structures fabricated according to various exemplary embodiments of the present invention.
Figure 18B:
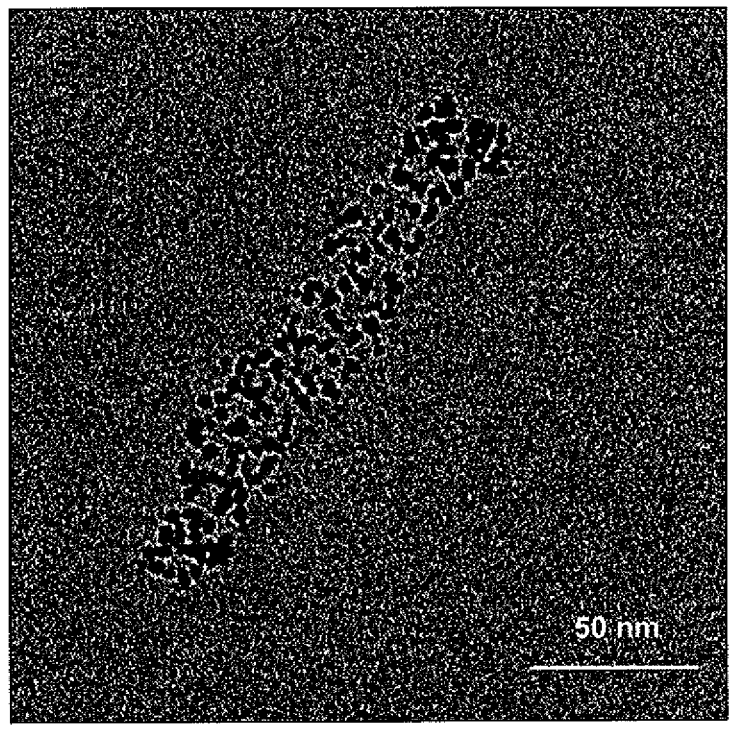

FIGS. 18A and 18B are TEM images of the gold nanowire structures. FIG. 18A shows a section of a nanowire structure (scale bar 2 μm), and FIG. 17B shows a magnified region marked by a white rectangle in FIG. 17A (scale bar 50 nm).

FIG. 18A demonstrates that the nanowire structure comprises a pattern of linear sub-structures which are interconnected to form an elongated solid structure. FIG. 18B essentially shows a single sub-structure of the nanowire structure and demonstrate that the sub-structure is formed of a plurality of nanoparticles.

Some of the sub-structures are oriented in the direction of the nanowire structures.

Figure 19A:
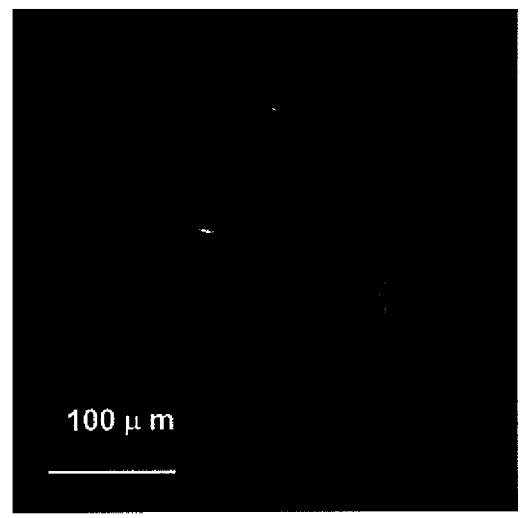
FIGS. 19A-C are BAM images of monolayers of the liquid composition formed according to various exemplary embodiments of the present invention various temperatures.
Figure 19B:
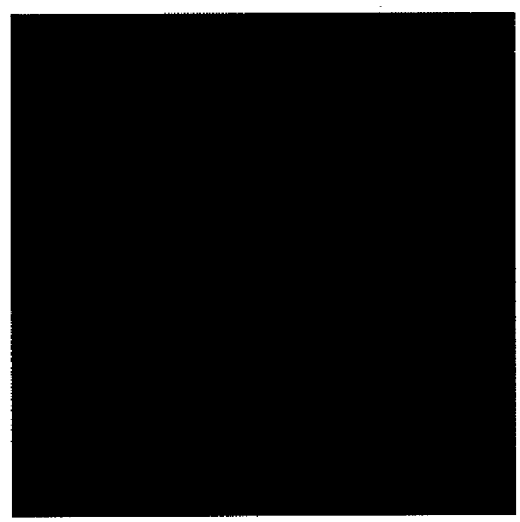
Figure 19C:
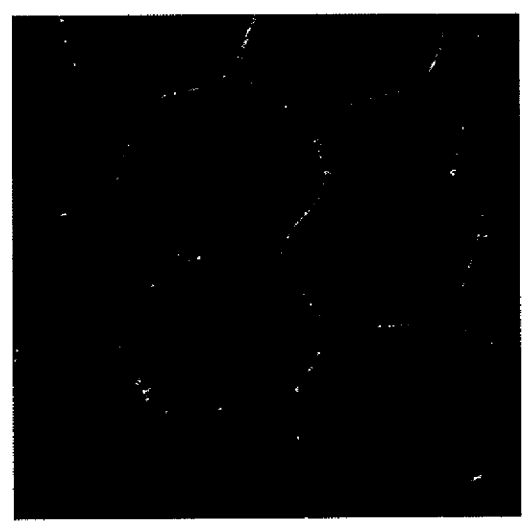

FIGS. 19A-C are BAM images of monolayers of the liquid composition at a temperature of 22.0° C. (FIG. 19A), 22.5° C. (FIG. 19B), and 23.0° C. (FIG. 19C). Scale bar corresponds to 100 μm.

The experiments presented in FIGS. 19A-C indicate that the structural reorganization induced by laser irradiation at different intensities is likely ascribed to local heating of the monolayer in the liquid-expanded phase. The pronounced temperature-induced ordering of the nanostructures, apparent both in millimeter-scale (FIGS. 16A-E and 17A-C) as well as sub-micron scale (FIGS. 18A and 18B) is unique. Without being bound to any specific theory it is assumed that the very small temperature range in which ordering of the nanostructures occurred indicates that there is a phase window in the liquid-expanded monolayer. In such a state of the monolayer, a slight increase in temperature disrupts the interactions between the fatty acids and the embedded nanostructures, leading to the formation of the highly organized two-dimensional structures stabilized by the attraction between the shells of adjacent nanostructures.

The above experiments demonstrate the counter-intuitive phenomenon discovered by the present Inventors, according to which hierarchically-ordered nanowires structures are induced by heating monolayers which comprises nanostructures and a fatty acid.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of forming a nanowire structure, comprising:
    applying on a surface of carrier liquid a layer of a liquid composition which comprises a surfactant and a plurality of nanostructures, each nanostructure having a core enclosed by a hydrophobic or amphiphilic shell; and
    heating at least one of said carrier liquid and said liquid composition to a temperature selected such that said nanostructures are segregated from said surfactant and assemble into a nanowire structure on said surface.

2. The method according to claim 1, further comprising preparing said liquid composition.

3. The method according to claim 2, further comprising coating nanoparticles by hydrophobic or amphiphilic shells thereby forming said nanostructures.

4. The method according to claim 1, further comprising transferring said nanowire structure from said surface of said carrier liquid to a solid support.

5. The method according to claim 4, further comprising treating said nanowire structure so as to remove said shells from said nanostructures.

6. The method according to claim 1, wherein said heating is effected by laser radiation.

7. The method according to claim 6, further comprising scanning said layer by said laser radiation along a predetermined pattern so as to locally heat said layer along said pattern and to shape said nanowire structure according to said pattern.

8. The method according to claim 6, further comprising scanning said layer by said laser radiation along a predetermined pattern so as to locally heat said layer along said pattern and to form on said surface a circuitry of nanowire structures according to said pattern.

9. The method according to claim 1, wherein said layer is in a liquid-expanded phase.

10. The method according to claim 1, wherein said temperature is selected such that said segregation and said assembling is reversible.

11. The method according to claim 1, wherein said temperature is higher than a threshold temperature defined as a minimal temperature at which there is no phase transition from a liquid-expanded phase to a liquid-condensed phase anywhere on said layer for any surface pressure of said layer, and wherein a difference between said temperature and said threshold temperature is less that 1 degree centigrade.

12. The method according to claim 1, wherein said surfactant is an amphiphilic compound.

13. The method according to claim 1, wherein said surfactant is a fatty acid.

14. The method according to claim 1, wherein said shell comprises a thiol-containing hydrocarbon chain.

15. The method according to claim 1, wherein said shell comprises an amine-containing hydrocarbon chain.

16. The method according to claim 1, wherein said shell is prepared from a surfactant selected from the group consisting of dodecanethiol, octanethiol, dodecylamine, tetradecylammonium bromide, tetraoctylammonium bromide and any mixture thereof.

17. The method according to claim 1, wherein said core is made of a metal.

18. The method according to claim 1, wherein said core is made of a material selected from the group consisting of a semiconductor material, a dielectric material and a ferromagnetic material.

19. The method according to claim 1, wherein said carrier liquid is an aqueous solution.

20. The method according to claim 1, wherein said carrier liquid is water.

* * * * *